(12) United States Patent
Kawae

(10) Patent No.: US 7,525,472 B2
(45) Date of Patent: Apr. 28, 2009

(54) INTEGRATION TYPE AND CONVERTER AND DEVICE INCLUDING SAME

(75) Inventor: Daisuke Kawae, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/963,312

(22) Filed: Dec. 21, 2007

(65) Prior Publication Data

US 2008/0158030 A1  Jul. 3, 2008

(30) Foreign Application Priority Data

Dec. 27, 2006  (JP) .............................. 2006-351791

(51) Int. Cl.
*H03M 1/50*  (2006.01)
(52) U.S. Cl. ................. 341/166; 341/155; 327/540; 363/89; 348/229.1
(58) Field of Classification Search ......... 341/155–166; 327/540; 363/89; 348/220.1
See application file for complete search history.

(56) References Cited

U.S. PATENT DOCUMENTS

| 4,661,803 | A | | 4/1987 | Nishiyama et al. |
| 5,184,128 | A | | 2/1993 | Snow |
| 5,883,535 | A | * | 3/1999 | Kato ........................... 327/170 |
| 6,087,970 | A | | 7/2000 | Panicacci |
| 6,169,440 | B1 | * | 1/2001 | Liu .............................. 327/337 |
| 6,587,000 | B2 | | 7/2003 | Oikawa |
| 7,030,799 | B2 | * | 4/2006 | Lee et al. ..................... 341/144 |
| 7,148,727 | B2 | * | 12/2006 | Van Bogget ................. 327/77 |
| 7,289,145 | B2 | * | 10/2007 | Johnson et al. .......... 348/229.1 |

FOREIGN PATENT DOCUMENTS

| JP | 07-22950 | 1/1995 |
| JP | 2550889 | 11/1996 |
| JP | 3100457 | 10/2000 |

OTHER PUBLICATIONS

Reinhard Petschacher et al. "A 10-b 75-MSPS Subranging A/D Converter with Integrated Sample and Hold"; *IEEE Journal of Solid-State Circuits*, vol. 25, No. 6; pp. 1339-1346; Dec. 6, 1990.

* cited by examiner

*Primary Examiner*—Lam T Mai
(74) *Attorney, Agent, or Firm*—Fish & Richardson P.C.

(57) ABSTRACT

An integration type A/D converter in which a dynamic range is enlarged while keeping a simple circuit configuration is provided. Offset potential of an integrator is to be variable. Specifically, offset potential in proportion to input potential is supplied to the integrator. Since an operation point of the integrator is changed in accordance with the input potential, a dynamic range can be enlarged. Further, reference potential input to the integrator in discharging is to be variable. Specifically, reference potential having a constant difference from the offset potential is input to the integrator. Accordingly, time necessary for discharging and the input potential are in proportion, so that a simple circuit configuration which is one feature of the integration type ADC can be maintained.

24 Claims, 24 Drawing Sheets

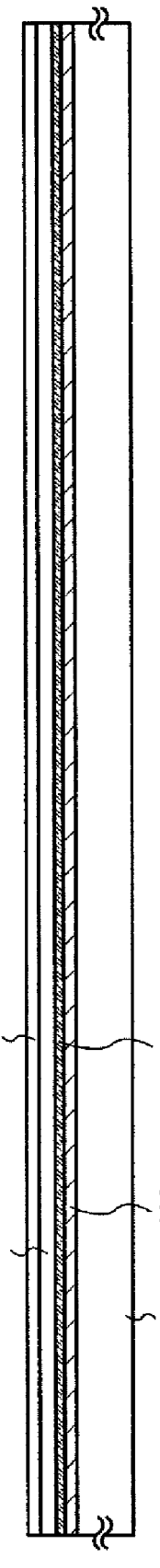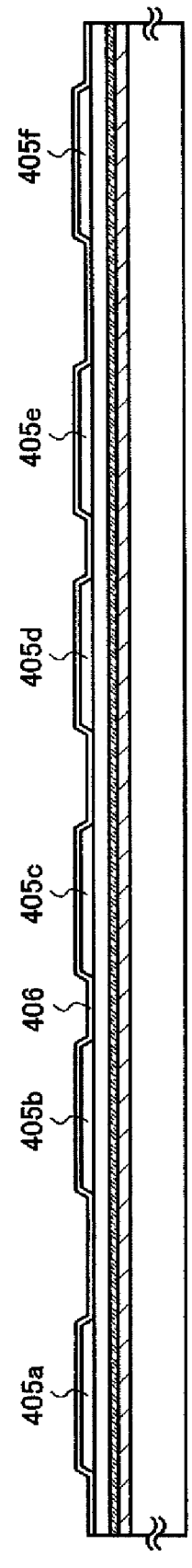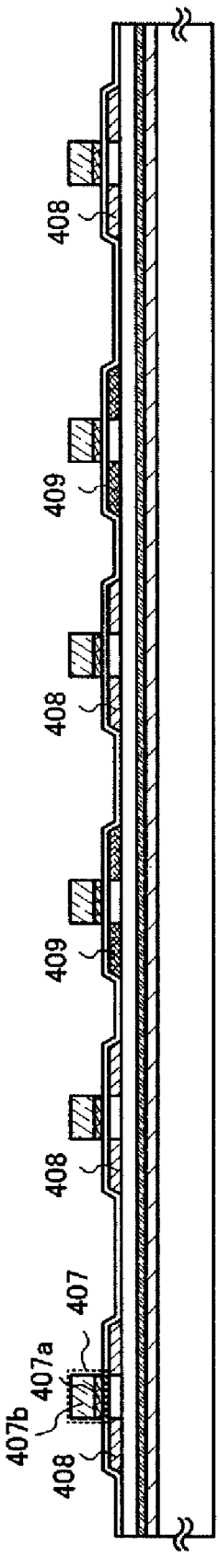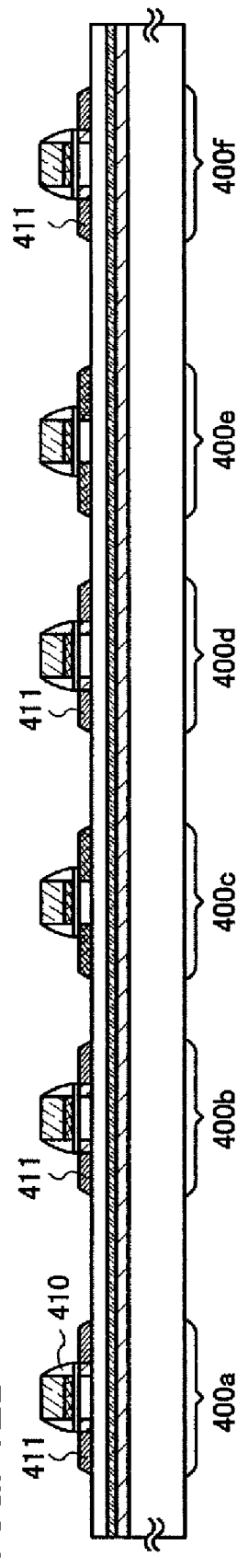

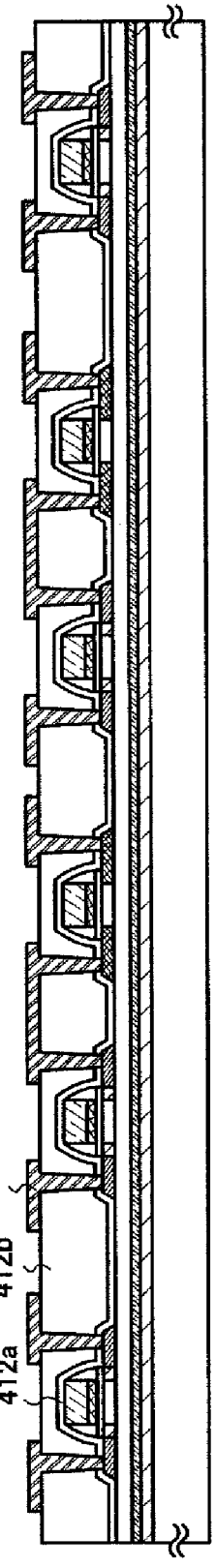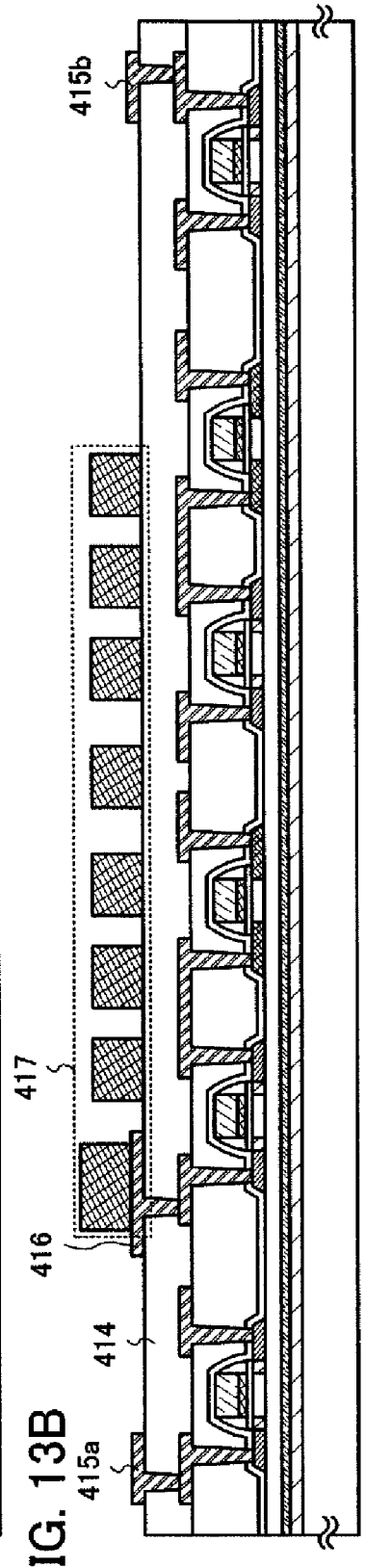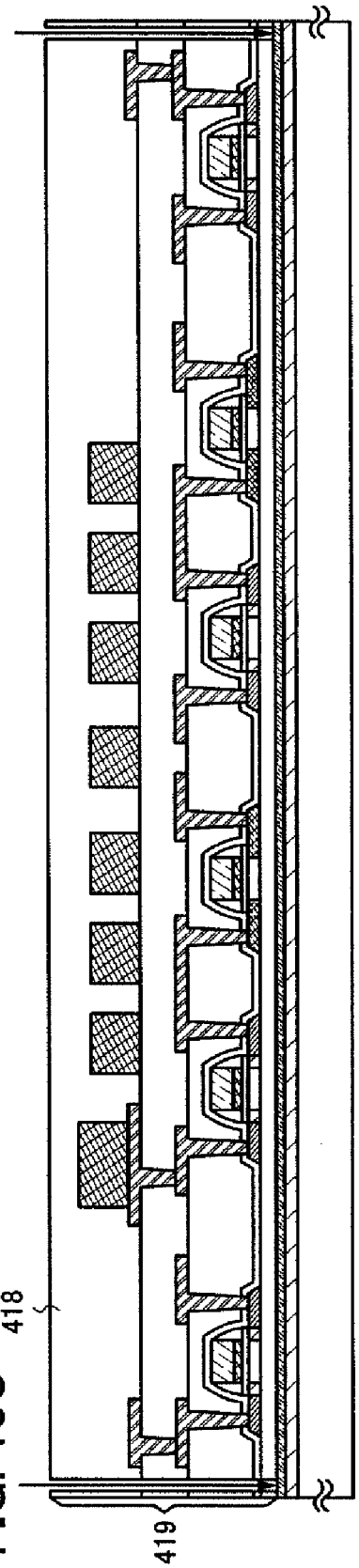

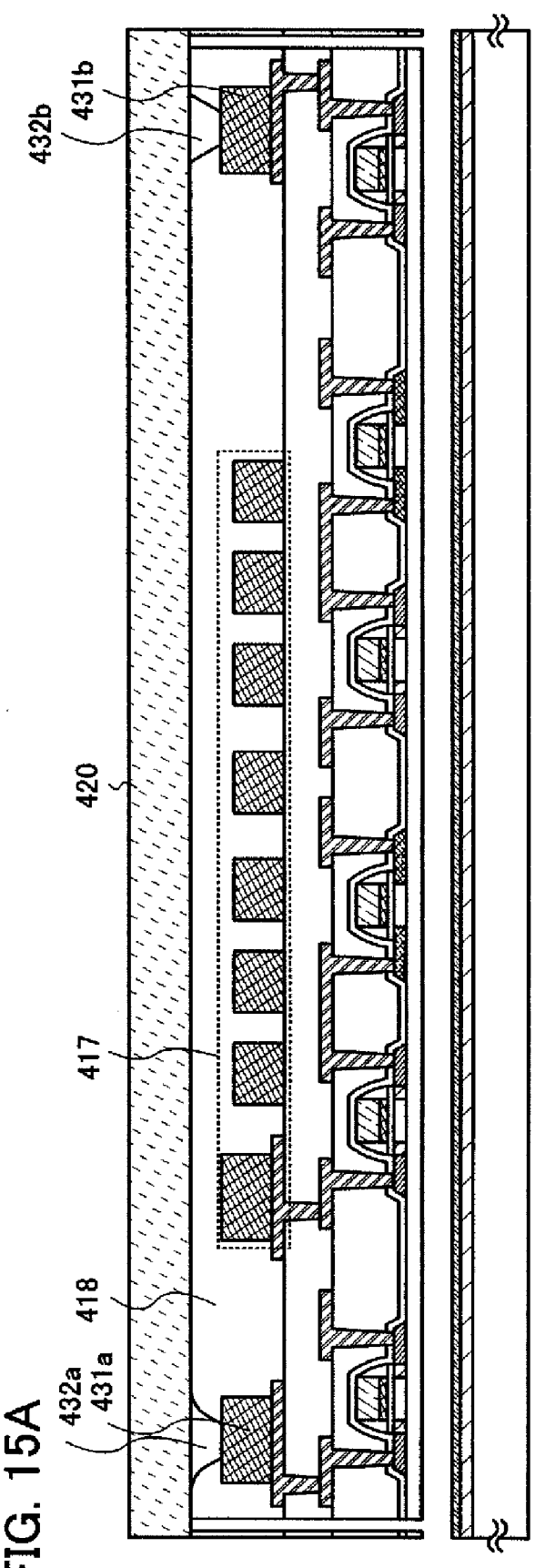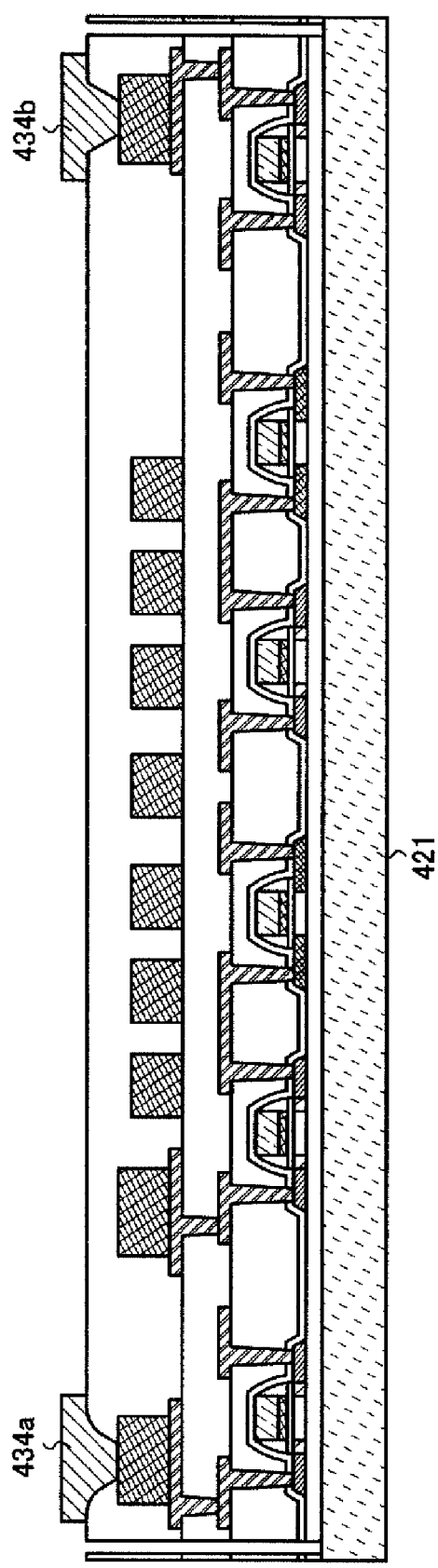

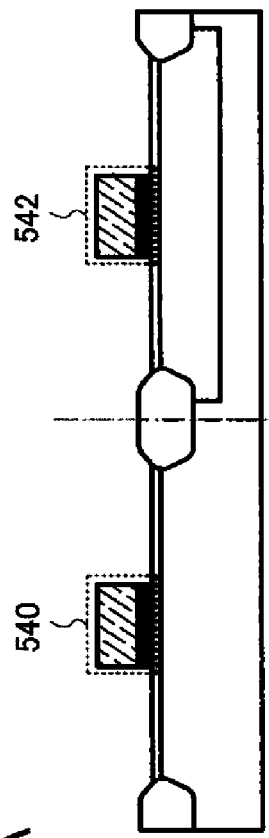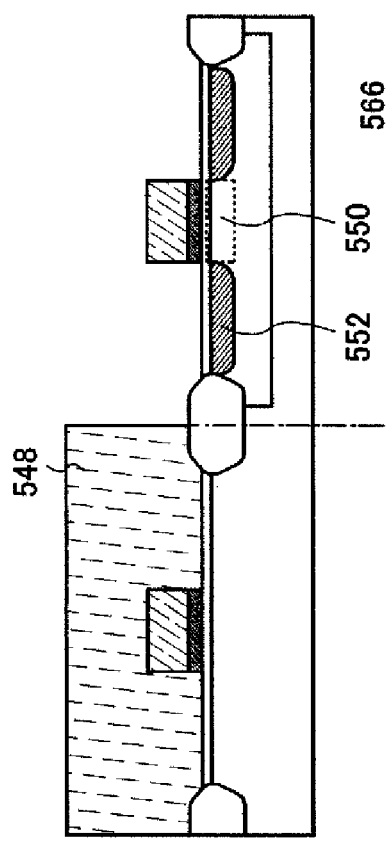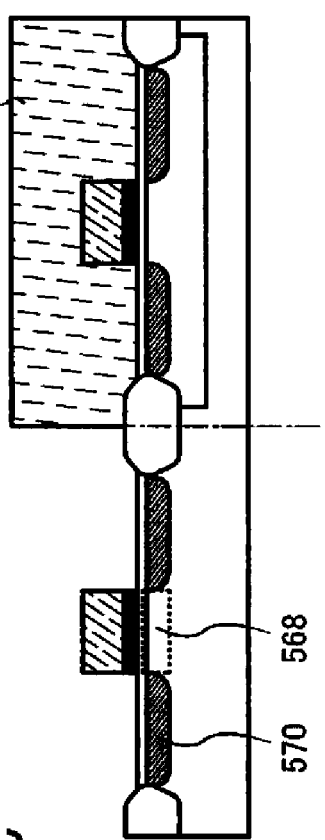

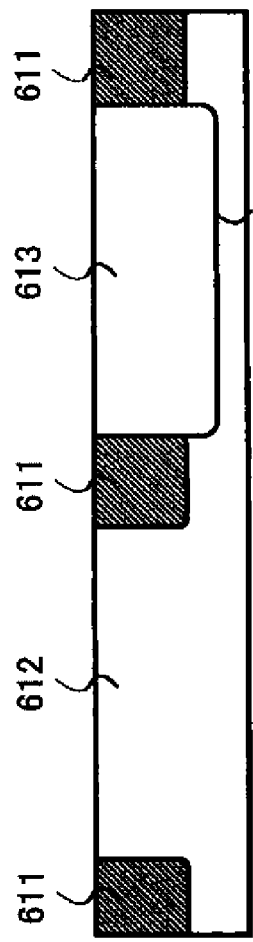
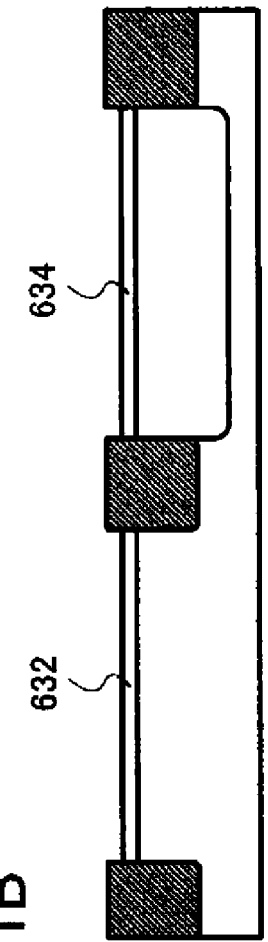
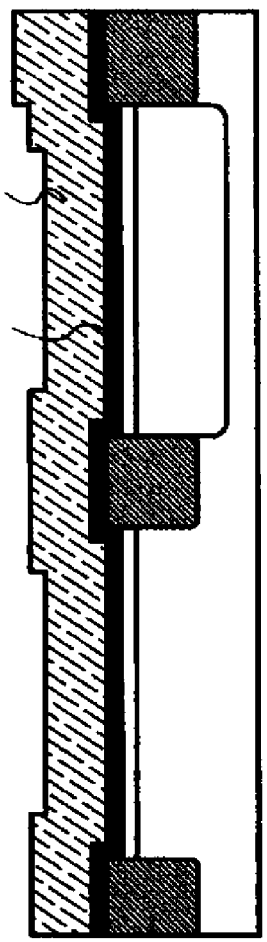
FIG. 21A
FIG. 21B
FIG. 21C

US 7,525,472 B2

INTEGRATION TYPE AND CONVERTER AND DEVICE INCLUDING SAME

BACKGROUND OF THE INVENTION

1. Field of the Invention

The present invention relates to an integration type A/D converter (analog-to-digital converter). Further, the present invention relates to a semiconductor device including the A/D converter and an electronic device.

2. Description of the Related Art

The physical quantity of sound, light, heat, power, an electric field, and a magnetic field in the natural world can be expressed as an analog parameter. On the other hand, in the fields of measurement, control, communication, and the like, digitalization of data processing has been advanced. A digital camera or the like is a good example of consumer-electronic devices. When the physical quantity which is treated as the analog quantity originally is treated as the digital quantity, an A/D converter (an analog-to-digital converter, hereinafter referred to as an ADC) serves as an interface between analog data and digital data. That is, the ADC converts analog data to digital data. When various physical quantities as described above in the natural world are processed as data, the ADC is necessary in many cases. Therefore, the ADC can be applied to various fields and is very important.

There are various types of ADCs, typically, a successive-approximation type, a parallel-comparison type (also referred to as a flash type), a $\Delta\Sigma$ type (also referred to as a $\Sigma\Delta$ type), an integration type, and the like.

The integration type ADC has a low conversion rate compared to other types but a simple circuit configuration, and thus can be manufactured at low cost and is not easily influenced by noise. Therefore, the integration type ADC is used in noisy environment, for applications which do not require a high update rate, or the like.

The operating principle of a dual slope type ADC, which is one kind of integration type ADCs and often used, will be described with reference to FIGS. 2 and 3. FIG. 2 illustrates a main portion of a circuit constituting the dual slope type ADC. The dual slope type ADC includes an integrator 154 having an operational amplifier 151, a resistor 152, and a capacitor 153; a first switch 156 which initializes output potential $V_{out}$ of the integrator 154; a second switch 158 which serves as a charging switch for inputting input potential $V_{in}$ to the integrator 154; and a third switch 160 which serves as a discharging switch for inputting reference potential $V_{ref}$ into the integrator 154.

Note that "potential" denotes relative potential energy when electric potential energy of a grounded electric node is set to be 0 here. This is also applied to the following description. However, it is sufficient that potential at an electric node which is a reference of an entire circuit can be clearly determined. It is not always necessary to set ground potential to be 0, and the spirit of the present invention hereinafter described is not limited thereto, either.

Operation of the conventional dual slope type ADC illustrated in FIG. 2 will be described hereinafter. First, the first switch 156 is turned on to cause a short circuit between two terminals of the capacitor 153, and the integrator 154 is initialized so that output potential $V_{out}$ becomes offset potential $V_{offset}$. Next, the first switch 156 is turned off and then the second switch 158 is turned on, and input signals are accumulated in the integrator 154 for a certain period of time, so that electric power is stored there. Finally, the second switch 158 is turned off and then the third switch 160 is turned on, and electric power is released so that the output potential $V_{out}$ of the integrator 154 returns to a level in initialization, i.e., the offset potential $V_{offset}$. By counting a period for discharge (discharging period), A/D conversion can be performed.

The discharging period is counted as follows: a count-up operation is started at a time when the third switch 160 is turned on, and the count-up operation is finished at a time when the output potential $V_{out}$ is equal to the offset potential $V_{offset}$. Known counter circuits may be used for the count-up operation. Since the count-up operation is started at 0, a value obtained by multiplying digital data stored in the counter circuit in completion of the count-up operation by a clock cycle becomes a discharging period. That is, reset signals and clock signals for a certain period of time are used to control the counter circuit. In addition, in order to detect a point at which the output potential $V_{out}$ is equal to the offset potential $V_{offset}$, a known comparator circuit which is not illustrated here may be used. That is, the output potential $V_{out}$ is input to one of two input terminals of the comparator circuit and the offset potential $V_{offset}$ is input to the other. Besides, a known circuit which combines logical gates may be used to control the first to third switches.

FIG. 3 shows a change of the output potential $V_{out}$ of the integrator 154 with time. The x axis represents time and the y axis represents the output potential $V_{out}$ of the integrator 154. In this case, the case is shown in which input voltage $V_{in1}$ (a difference between the input potential $V_{in}$ and the offset potential $V_{offset}$) and input voltage $V_{in2}$ which is twice as large as $V_{in1}$ (a difference between the input potential $V_{in}$ and the offset potential $V_{offset}$) are input. The output potential $V_{out}$ of the integrator 154 at a start of the charging period $T_1$ is equal to the offset potential $V_{offset}$ regardless of a value of the input voltage $V_{in1}$ or the input voltage $V_{in2}$. In the charging period $T_1$, the output potential $V_{out}$ of the integrator 154 changes in accordance with a level of the input voltage $V_{in1}$ or the input voltage $V_{in2}$ in a linear manner. Therefore, output voltage $V_{out1}$ (a difference between the output potential $V_{out}$ and the offset potential $V_{offset}$) and output voltage $V_{out2}$ (a difference between the output potential $V_{out}$ and the offset potential $V_{offset}$) of the integrator 154 in completion of the charging period $T_1$ have a level which has changed in accordance with the input voltage $V_{in1}$ or the input voltage $V_{in2}$ in a linear manner. Next, reference voltage having opposite polarity to the input voltage $V_{in1}$ or the input voltage $V_{in2}$ is input to the integrator 154, so that the output potential $V_{out}$ of the integrator 154 is changed with a slope of opposite polarity to that in charging. At this time, since the reference voltage is constant, a slope of the output potential $V_{out}$ changing with time is constant regardless of the input voltage $V_{in1}$ or the input voltage $V_{in2}$ in charging. As a result, a period $T_{21}$ or a period $T_{22}$, which is required until the output potential $V_{out}$ of the integrator 154 returns to a level in initialization, is varied in accordance with a level of the input voltage $V_{in1}$ or the input voltage $V_{in2}$ in a linear manner.

Note that in the example of FIG. 2, when the input voltage is $V_{in1}$, the output voltage and the discharging period are $V_{out1}$ and $T_{21}$, respectively. Further, when the input voltage is $V_{in2}$, the output voltage and the discharging period are $V_{out2}$ and $T_{22}$, respectively.

In general, the following equation (1) is obtained using the charging period $T_1$, the discharging period $T_2$, the input potential $V_{in}$, the reference potential $V_{ref}$, and the offset potential $V_{offset}$.

$$(V_{in}-V_{offset})*T_1+(V_{ref}-V_{offset})*T_2=0 \quad (1)$$

Note that the integration type ADC is generally operated under the condition of $V_{offset}=0$, $V_{in}>0$, and $V_{ref}<0$. However, the present invention is not limited thereto as long as ($V_{in}-$ $V_{offset}$) and ($V_{ref}$-$V_{offset}$) have opposite polarity, i.e., ($V_{in}$-$V_{offset}$)>0 and ($V_{ref}$-$V_{offset}$)<0, or ($V_{in}$-$V_{offset}$)<0 and ($V_{ref}$-$V_{offset}$)>0.

In order to operate the integration type ADC normally, it is necessary that the integrator 154 inside the ADC operates correctly. Specifically, the condition under which the output potential $V_{out}$ of the integrator 154 is not saturated during operation is a condition under which the integration type ADC operates normally. That is, the condition under which the integration type ADC operates normally can be expressed by the following equation (2).

$$\left| \frac{(V_{in} - V_{offset}) * T_1}{R * C} \right| < |V_{limit} - V_{offset}| \tag{2}$$

In the above equation, R represents resistance of the resistor 152 included in the integrator 154, C represents capacitance of the capacitor 153 included in the integrator 154, $V_{limit}$ represents the limit of the output potential which can operate the integrator 154 correctly, the left-hand side of the equation represents a change in output potential $V_{out}$ of the integrator 154 in the charging period $T_1$, and the right-hand side represents a range of a change in output potential $V_{out}$ of the integrator 154. In the case of $V_{in}$>$V_{offset}$, $V_{limit}$<$V_{offset}$, and $V_{limit}$ represents the lower limit of the output potential in the range in which the integrator 154 can be operated correctly. Hereinafter, the case of $V_{in}$>$V_{offset}$ will be described but the description also applies to the case of $V_{in}$<$V_{offset}$.

When the equation (2) is solved for $V_{in}$, the following equation (3) is obtained.

$$V_{offset} < V_{in} < \frac{(V_{offset} - V_{limit}) * R * C}{T_1} + V_{offset} \tag{3}$$

In the equation (3), the range of values of the input potential $V_{in}$ (hereinafter referred to as a dynamic range) is limited by various parameters which determine the operation of the integrator. Accordingly, various methods have been provided to enlarge the dynamic range (e.g., Reference 1: Japanese Patent No. 3100457 and Reference 2: Japanese Patent No. 2550889).

SUMMARY OF THE INVENTION

As one method to enlarge the dynamic range, there is a method in which a time constant (R×C) of the integrator is changed depending on the input. However, in this method, the amount of hardware (an area of a circuit formed) is increased. Further, a technique called multi-sloping is known. Multi-sloping is a technique in which a power source that is neither an input potential nor a reference potential is prepared to compensate for the quantity of electric charge transmitted to the integrator, so that effective voltage amplitude larger than the physical limit of the integrator is obtained. However, when multi-sloping is used, there have been problems in that a new reference power source, switch, and the like are necessary and a peripheral circuit which controls the integrator gets complicated.

As another method, the charging period $T_1$ may be shortened; however, since resolving power that is a performance indicator of the ADC is influenced, there is a limitation.

Alternatively, by shortening a clock cycle for counting the discharging period $T_2$, resolving power can be maintained theoretically while the charging period $T_1$ is shortened. However, the clock cycle is limited by the response speed of the peripheral circuit. Further, when the clock cycle is shortened, power consumption is increased; therefore, low power consumption cannot be easily achieved.

In view of the above problems, the present invention provides an integration type ADC in which a dynamic range is enlarged while keeping a simple circuit configuration. Specifically, the present invention focuses on a point that the above problems are caused by constant offset potential. In the integration type ADC, the output potential of the integrator returns to a level in initialization after charging operation and discharging operation. However, since offset potential $V_{offset}$ that is an initialization potential at this time is fixed ($V_{offset}$ is constant), it is difficult to enlarge the dynamic range.

In an analog-to-digital converter of the present invention, offset potential $V_{offset}$ is to be variable. Specifically, with the use of offset potential $V_{offset}$ represented by the following equation (4), offset potential $V_{offset}$ in accordance with input potential $V_{in}$ is supplied to the integrator.

$$V_{offset} = k * V_{in} \tag{4}$$

Note that k is a constant where 0<k<1. Further, reference potential $V_{ref}$ represented by the following equation (5) is used.

$$V_{offset} - V_{ref} = V_{const} \tag{5}$$

Note that $V_{const}$ is a constant. The equation (1) is represented by the following equation (6), and an output period $T_2$ is in proportion to the input potential $V_{in}$.

$$T_2 = \frac{T_1 * (1 - k) * V_{in}}{V_{const}} \tag{6}$$

Note that in this specification, a MOSFET (metal oxide silicon field effect transistor) and a TFT (thin film transistor), which are one kind of transistors, are not particularly distinguished. Therefore, the description "transistor" may also mean a TFT. Similarly, the description "TFT" may also mean a transistor.

In this specification, a semiconductor device means a device having a transistor and also includes a display device and the like.

With the use of the present invention, in the integration type ADC, a dynamic range can be enlarged compared to a conventional type, while keeping a simple circuit configuration. Further, various parameters which determine operation of the integration type ADC can be more freely set. Consequently, resolving power can be improved in the case of keeping a dynamic range. Further, by lengthening a clock cycle for counting a discharging period, power consumption can be reduced.

Furthermore, an output period $T_2$ is a linear function of input potential $V_{in}$ in the conventional type ADC; however, according to the present invention, the output period $T_2$ is in proportion to the input potential $V_{in}$ regardless of offset potential $V_{offset}$. Accordingly, it is not necessary to consider the offset voltage in input and output, so that the output period $T_2$ is not varied and digital data that is obtained can be more precise.

BRIEF DESCRIPTION OF THE DRAWINGS

In the accompanying drawings:

FIGS. 12A to 12D are explanatory views of a manufacturing method of a semiconductor device to which the present invention is applied;

FIGS. 13A to 13C are explanatory views of a manufacturing method of a semiconductor device to which the present invention is applied;

FIGS. 15A and 15B are explanatory views of a manufacturing method of a semiconductor device to which the present invention is applied;

FIGS. 18A to 18C are explanatory views of a manufacturing method of a semiconductor device to which the present invention is applied;

FIGS. 21A to 21C are explanatory views of a manufacturing method of a semiconductor device to which the present invention is applied;

DETAILED DESCRIPTION OF THE INVENTION

Hereinafter, embodiment modes of the present invention will be described with reference to the accompanying drawings. Note that the present invention can be implemented in various modes, and it is easily understood by those skilled in the art that modes and details thereof can be modified in various ways without departing from the spirit and the scope of the present invention. Therefore, the present invention should not be interpreted as being limited to the description of the embodiment modes.

Embodiment Mode 1

Figure 1:
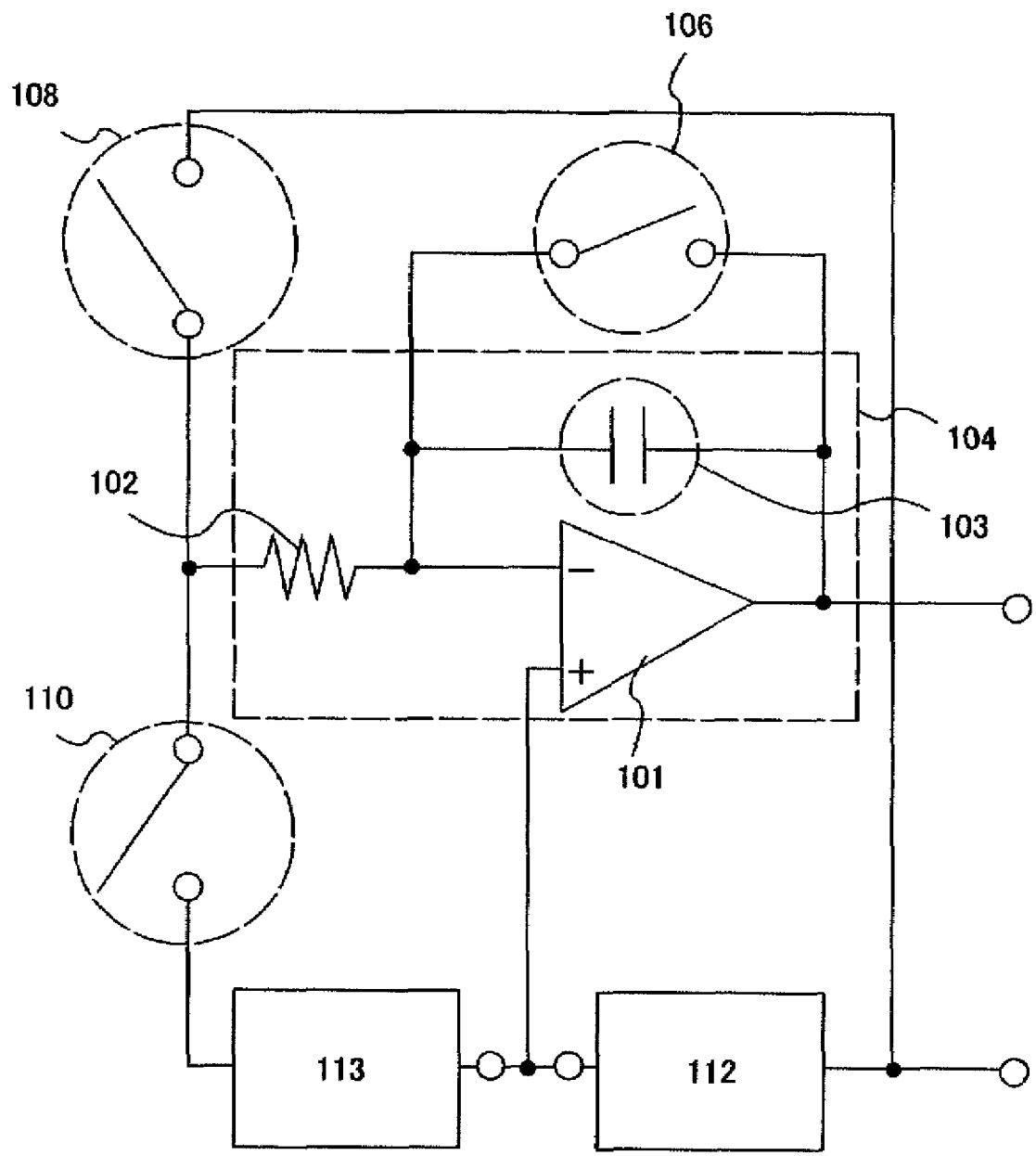
FIG. 1 is an explanatory diagram of an analog-to-digital converter according to the present invention.

This embodiment mode will describe an example of a configuration of an analog-to-digital converter (ADC) according to the present invention with reference to FIG. 1.

FIG. 1 is a circuit diagram illustrating an example of a configuration of an ADC according to the present invention. The ADC shown in FIG. 1 includes an integrator 104 having an operational amplifier 101, a resistor 102, and a capacitor 103; a first switch 106 which initializes output potential $V_{out}$ of the integrator 104; a second switch 108 which serves as a charging switch for inputting input potential $V_{in}$ into the integrator 104; a third switch 110 which serves as a discharging switch for inputting reference potential $V_{ref}$ into the integrator 104; a multiplier circuit 112 for generating offset potential $V_{offset}$ from the input potential $V_{in}$; and a subtraction circuit 113 for generating reference potential $V_{ref}$ from the offset potential $V_{offset}$. An input potential $V_{in}$ terminal and a reference potential $V_{ref}$ terminal are connected to one terminal of the resistor 102 through the second switch 108 and the third switch 110, respectively. The other terminal of the resistor 102 is connected to an inverted input terminal (−) of the operational amplifier 101. The capacitor 103 is connected between the inverted input terminal (−) and an output terminal of the operational amplifier 101.

In order to initialize the output potential $V_{out}$ of the operation amplifier 101, the first switch 106 is connected between two terminals of the capacitor 103. The input potential $V_{in}$ is input through the second switch 108 to the integrator 104 and the multiplier circuit 112 at the same time, and the offset potential $V_{offset}$ is output from the multiplier circuit 112. Note that the offset potential $V_{offset}$ and the input potential $V_{in}$ satisfy the following equation (4).

$$V_{offset} = k * V_{in} \quad (4)$$

The offset potential $V_{offset}$ is input to a non-inverted input terminal (+) of the operational amplifier 101 and the subtraction circuit 113 at the same time, and the reference potential $V_{ref}$ is output from the subtraction circuit 113. Note that the offset potential $V_{offset}$ and the reference potential $V_{ref}$ satisfy the following equation (5).

$$V_{offset} - V_{ref} = V_{const} \quad (5)$$

Figure 2:
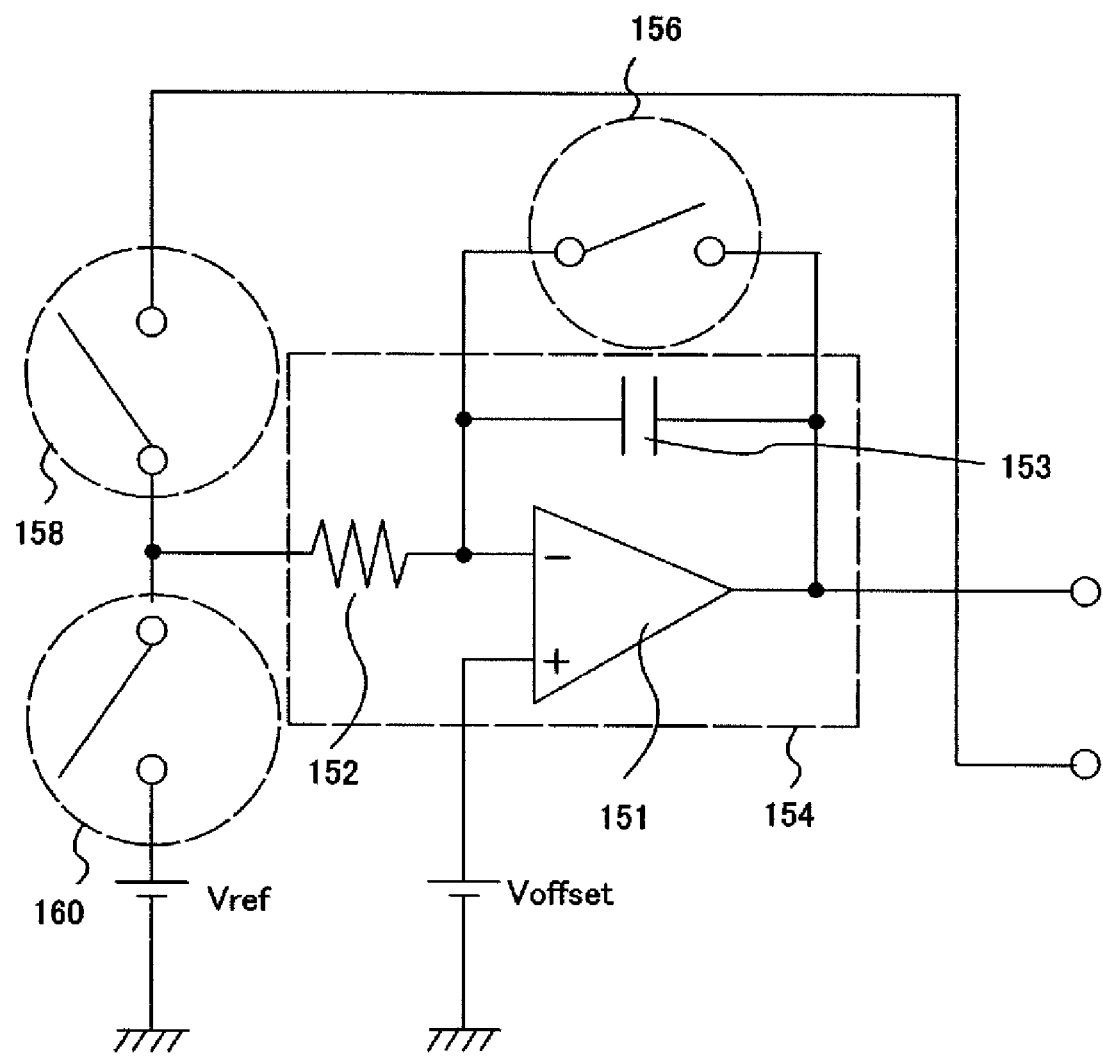
FIG. 2 is an explanatory diagram of an operation of a conventional analog-to-digital converter.
Figure 3:
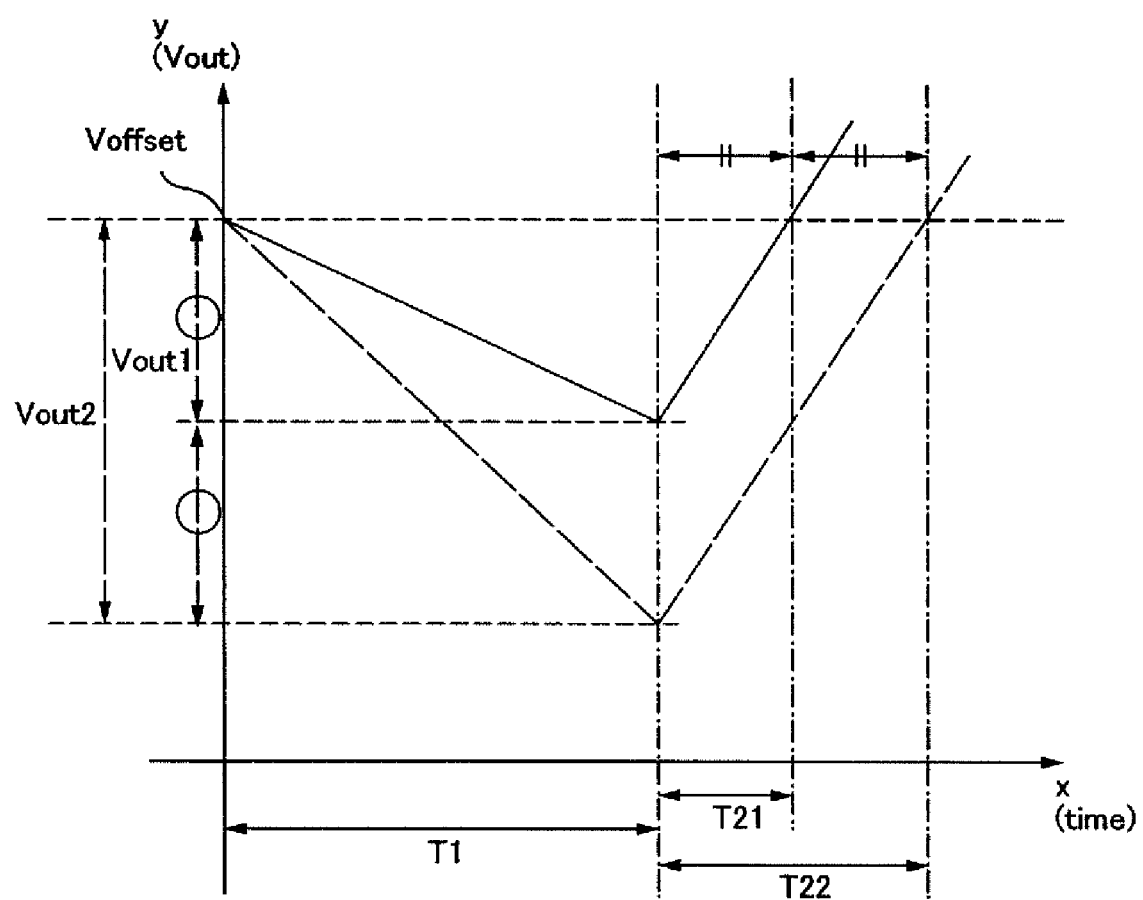
FIG. 3 is an explanatory diagram of a conventional analog-to-digital converter.

The integration type ADC of the present invention illustrated in FIG. 1 is greatly different from the conventional integration type ADC illustrated in FIG. 2 in that it has the multiplier circuit 112 and the subtraction circuit 113. In the conventional integration type ADC illustrated in FIG. 2, the offset potential $V_{offset}$ and the reference potential $V_{ref}$ are fixed (have constant values); however, in the ADC illustrated in FIG. 1, the offset potential $V_{offset}$ and the reference potential $V_{ref}$ are changed in accordance with the input potential $V_{in}$. Other than that, the ADC of the present invention operates in a similar manner to the conventional integration type ADC. Therefore, an input-output relation as represented by the following equation (6) is obtained.

$$T_2 = \frac{T_1 * (1-k) * V_{in}}{V_{const}} \quad (6)$$

Figure 4:
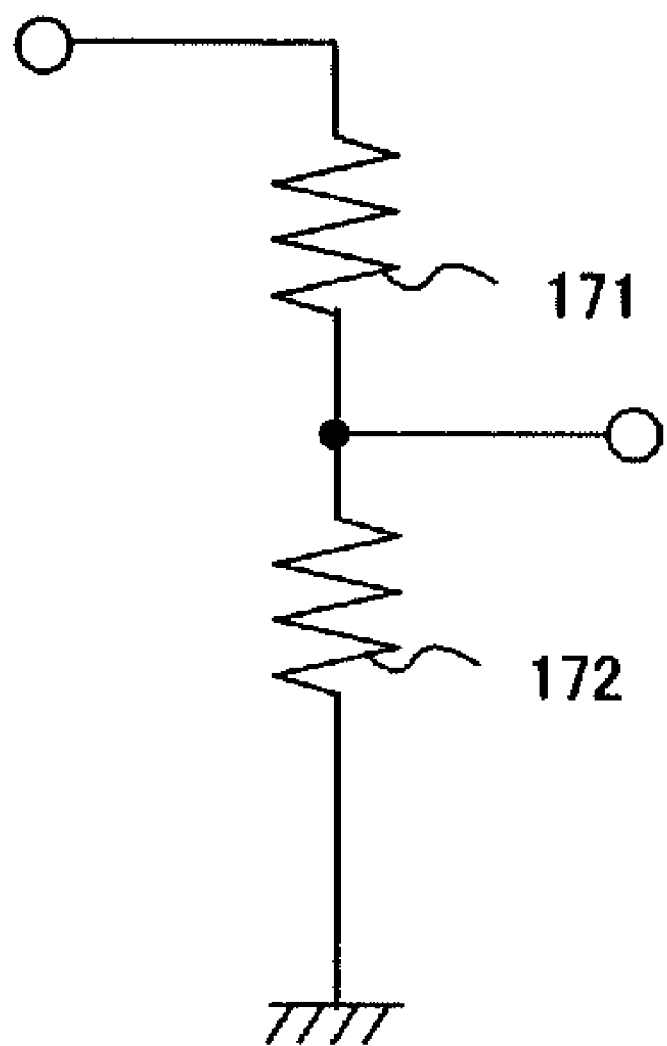
FIG. 4 is an explanatory diagram of a multiplier circuit included in an analog-to-digital converter according to the present invention.

FIG. 4 illustrates an example of a circuit configuration of the multiplier circuit 112. A resistor 171 and a resistor 172 are connected in series in the multiplier circuit 112. The input potential $V_{in}$ is input to series resistance thereof, and the offset potential $V_{offset}$ is taken out from a part where the resistors 171 and 172 are connected. At this time, by adjusting a voltage division ratio based on each resistance of the resistors 171 and 172, a proportionality constant k of the equation (4) is determined. In this example, a proportionality constant k is represented by the following equation.

$$k = \frac{R_2}{R_1 + R_2} \quad (7)$$

Note that $R_1$ and $R_2$ represent resistance of the resistors 171 and 172, respectively.

Figure 5A:
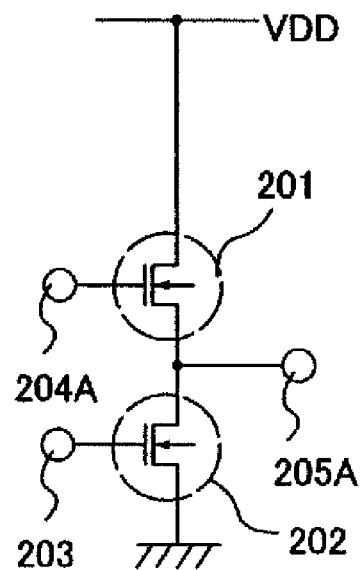
FIGS. 5A and 5B are explanatory diagrams of a subtraction circuit included in an analog-to-digital converter according to the present invention.
Figure 5B:
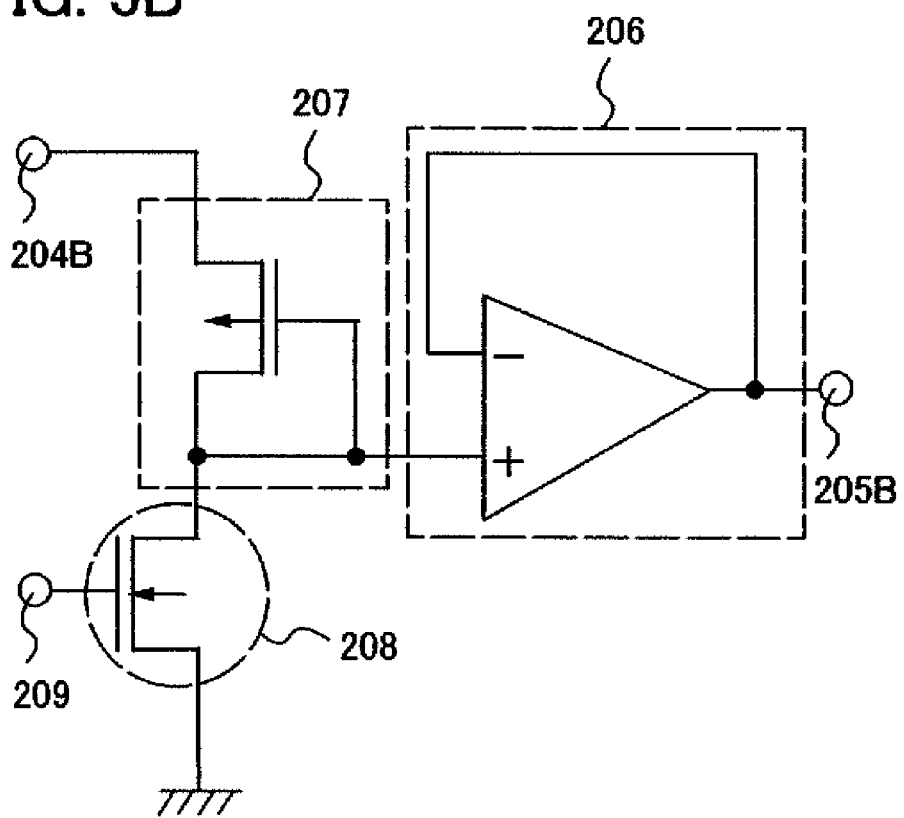

FIGS. 5A and 5B illustrate examples of a circuit configuration of the subtraction circuit 113. Here, the case where the input potential $V_{in}$, the offset potential $V_{offset}$, and the reference potential $V_{ref}$ satisfy $V_{in} > V_{offset} > V_{ref}$ will be described. FIG. 5A illustrates an example using a source follower. The circuit illustrated in FIG. 5A includes a first transistor 201 (n-type) serving as an amplifying transistor and a second transistor 202 (n-type) serving as a constant current source load. A drain electrode of the first transistor 201 is connected to power source potential $V_{DD}$, a source electrode of the second transistor 202 is connected to ground potential, and a source electrode of the first transistor 201 and a drain electrode of the second transistor 202 are connected to the reference potential $V_{ref}$ and an output terminal 205A. When the offset potential $V_{offset}$ is input to a gate electrode 204A of the first transistor 201 in a state in which bias potential $V_{bias}$ is input to a gate electrode 203 of the second transistor 202, potential of the output terminal 205A is set in accordance with the offset potential $V_{offset}$ and the bias potential $V_{bias}$. For example, when electric characteristics (DC characteristics) of the first transistor 201 and the second transistor 202 are equal to each other, there is a relation of $V_{ref} = V_{offset} - V_{bias}$. In this manner, a relation of the equation (5) is obtained. However, $V_{const} = V_{bias}$ in this embodiment mode. In order to operate the above circuit normally, it is necessary to operate the first transistor 201 and the second transistor 202 in a saturation region. When the first transistor 201 and the second transistor 202 are enhancement type, it is enough to satisfy $V_{DD} > V_{offset} > V_{ref} > V_{bias}$.

FIG. 5B illustrates an example using a voltage follower. The circuit illustrated in FIG. 5B includes a voltage follower 206, a first transistor 207 (p-type) connected as a diode, and a second transistor 208 (n-type) which performs reset to initialize input potential of the voltage follower 206. Offset potential $V_{offset}$ is connected to a source electrode 204B of the first transistor 207, and a drain electrode and a gate electrode thereof are connected to an input terminal of the voltage follower 206. Further, the input terminal of the voltage follower 206 is connected to a drain electrode of the second transistor 208. First, potential input to a gate electrode 209 of the second transistor 208 is controlled as appropriate, so that input potential of the voltage follower 206 is initialized. When the second transistor 208 is turned on, current flows between the source electrode and the drain electrode of each of the first transistor 207 and the second transistor 208. After that, the second transistor 208 is turned off. After the second transistor 208 is turned off, current flows continuously through the first transistor 207 until the channel is off. As a result, input potential of the voltage follower 206 becomes $(V_{offset} - |V_{th}|)$. Note that $V_{th}$ represents threshold voltage of the first transistor 207 where $V_{th} < 0$. In other words, the first transistor 207 is to be enhancement type. The potential $V_{ref}$ output from the output terminal 205B of the voltage follower 206 with some delay time becomes $(V_{offset} - |V_{th}|)$. In this manner, the equation (5) is achieved. Note that $V_{const} = |V_{th}|$ in this embodiment mode.

With the use of the present invention, in the integration type ADC, a dynamic range can be enlarged compared to a conventional type, while keeping a simple circuit configuration. Therefore, various parameters which determine operation of the integration type ADC can be more freely set. Consequently, resolving power can be improved in the case of keeping a dynamic range. In addition, by lengthening a clock cycle for counting a discharging period, power consumption can be reduced.

In addition, an output period $T_2$ is a linear function of the input potential $V_{in}$ in the conventional type ADC; however, according to the present invention, the output period $T_2$ is in proportion to the input potential $V_{in}$ regardless of the offset potential $V_{offset}$. Accordingly, it is not necessary to consider the offset voltage, so that the output period $T_2$ is not varied and digital data that is obtained can be more precise.

Embodiment Mode 2

Figure 6:
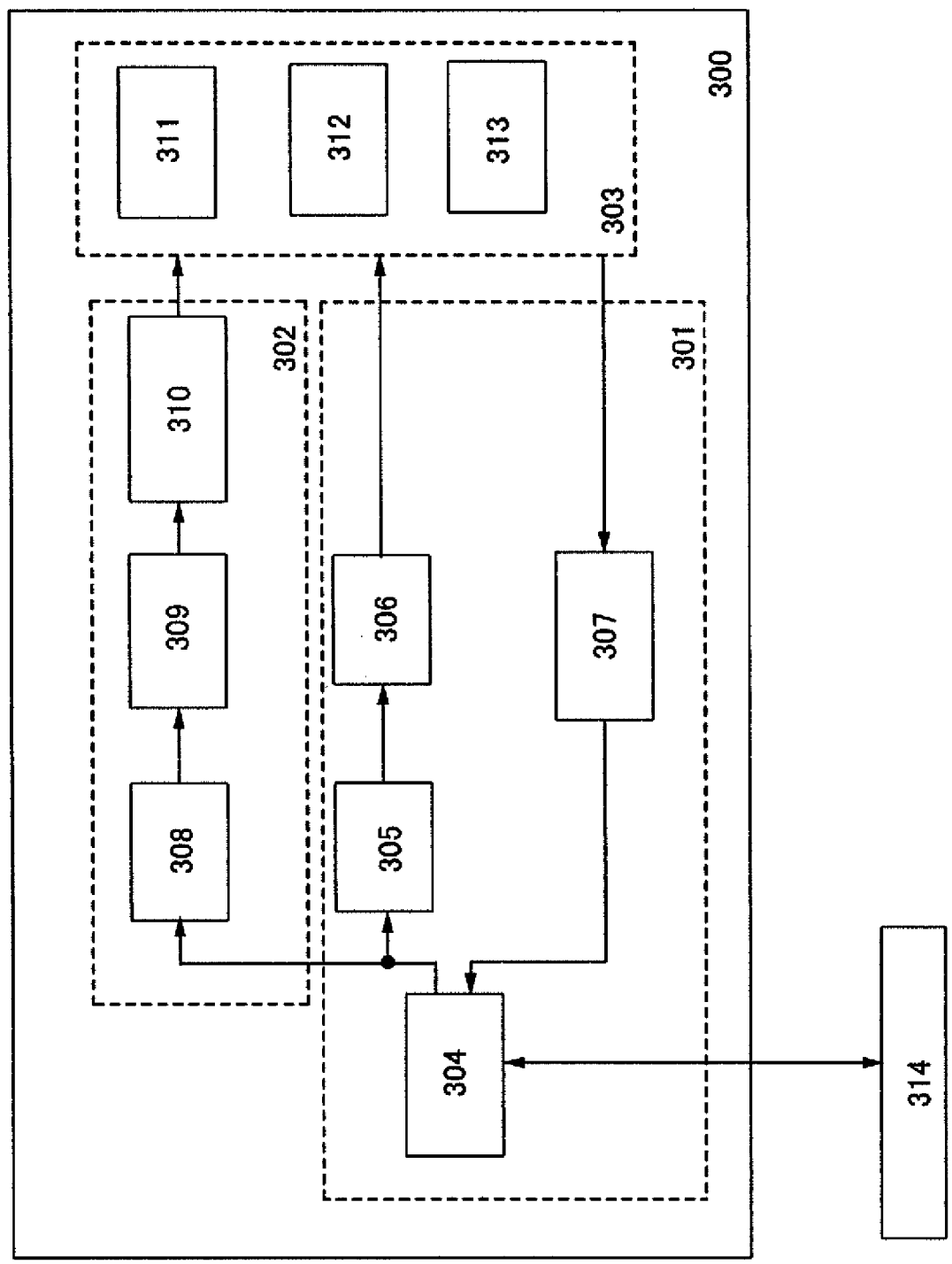
FIG. 6 is a diagram comparing input-output characteristics of a conventional integration type ADC and an integration type ADC according to the present invention.

This embodiment mode will describe a configuration of a semiconductor device capable of wireless communication and having the ADC described in Embodiment Mode 1. FIG. 6 is a block diagram of the semiconductor device capable of wireless communication. The semiconductor device capable of wireless communication illustrated in FIG. 6 transmits and receives data with radio signals using a reader/writer 314.

A semiconductor device 300 illustrated in FIG. 6 mainly includes a signal transmission/reception portion 301, a signal intensity detection portion 302, and a signal arithmetic portion 303. The signal transmission/reception portion 301 includes an antenna 304, a rectifier circuit 305, a demodulation circuit 306, and a modulation circuit 307. The signal intensity detection portion 302 includes a rectifier circuit 308, a power source circuit 309, and an ADC 310.

The antenna 304 receives electromagnetic waves sent from the reader/writer and generates AC induced voltage. This induced voltage serves as electric power for the semiconductor device 300 and includes data sent from the reader/writer.

Note that the shape of the antenna 304 which can be used for the semiconductor device 300 is not particularly limited. Therefore, an electromagnetic coupling method, an electromagnetic induction method, an electromagnetic wave method, and the like can be used for a method for transmitting and receiving signals in the semiconductor device 300. The transmission method may be selected as appropriate by a practitioner in consideration of application use, and an antenna having optimal length and shape may be provided in accordance with the transmission method. In the present invention, as a transmission method of signals, an electromagnetic induction method with a communication frequency of 13.56 MHz is preferably used.

In the case of employing an electromagnetic coupling method or an electromagnetic induction method (e.g., a 13.56 MHz band) as the transmission method, electromagnetic induction caused by a change in magnetic field density is used. Therefore, a conductive film functioning as an antenna is formed into an annular shape (e.g., a loop antenna) or a spiral shape (e.g., a spiral antenna).

In the case of employing a microwave method (e.g., a UHF band (860 to 960 MHz band), a 2.45 GHz band, or the like) which is one kind of electromagnetic wave method as the transmission method, a length or a shape of the conductive film functioning as an antenna may be appropriately set in consideration of a wavelength of an electromagnetic wave used for signal transmission. The conductive film functioning as an antenna can be formed into, for example, a linear shape (e.g., a dipole antenna), a flat shape (e.g., a patch antenna), and the like. The shape of the conductive film functioning as an antenna is not limited to a linear shape, and the conductive film functioning as an antenna may be formed into a curved-line shape, a meander shape, or a combination thereof, in consideration of a wavelength of an electromagnetic wave.

Figure 7A:
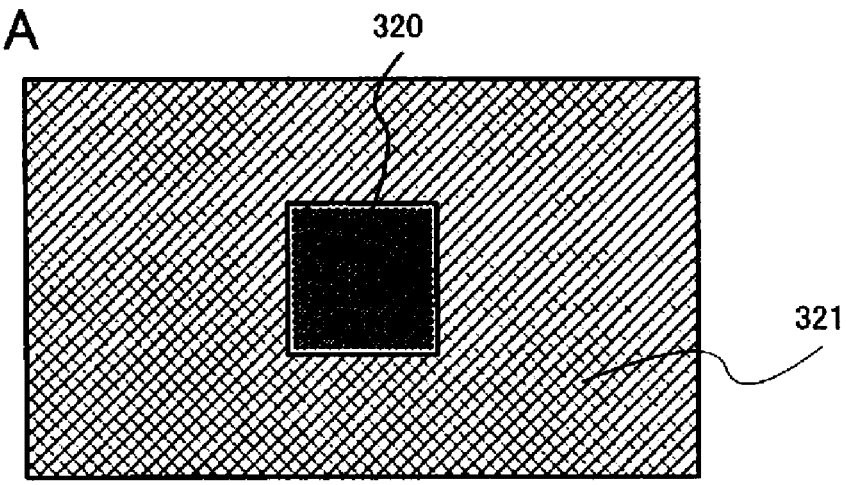
FIGS. 7A to 7E are explanatory views of a semiconductor device to which the present invention is applied.
Figure 7B:
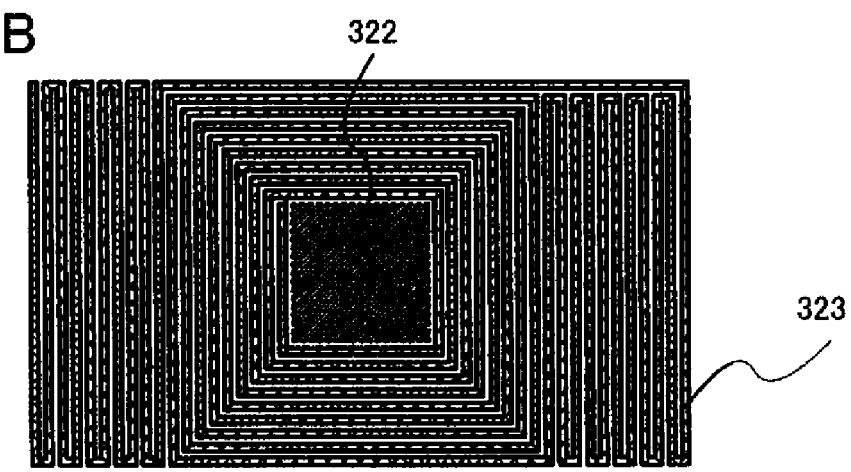
Figure 7C:
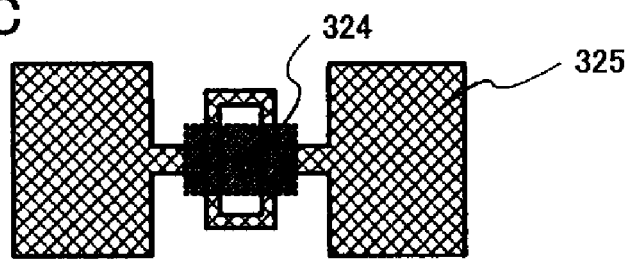
Figure 7D:
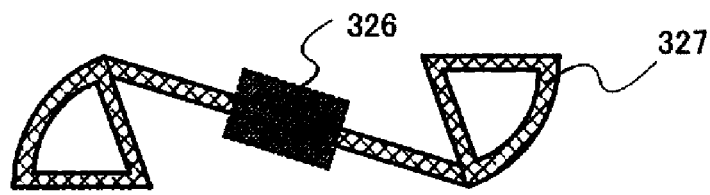
Figure 7E:
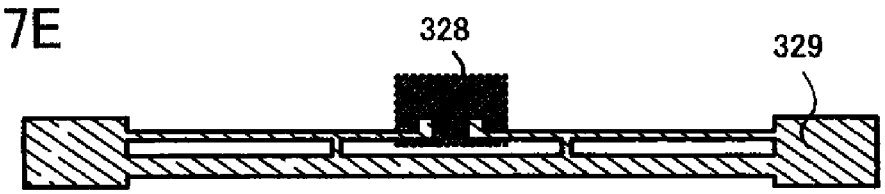

Here, examples of shapes of the antenna 304 are shown in FIGS. 7A to 7E. An antenna 321 may be provided all around a chip 320 provided with a signal processing circuit (FIG. 7A). Alternatively, a thin antenna 323 may be provided so as to be around a chip 322 provided with a signal processing circuit (FIG. 7B). Further alternatively, an antenna 325 may have a shape for receiving high-frequency electromagnetic waves with respect to a chip 324 provided with a signal processing circuit (FIG. 7C). Furthermore, an antenna 327 may have a shape which is 180° omnidirectional (capable of receiving signals from any direction) with respect to a chip 326 provided with a signal processing circuit (FIG. 7D). Further, an antenna 329 may have a shape which is extended to be long like a stick with respect to a chip 328 provided with a signal processing circuit (FIG. 7E). As the antenna 304, antennas with these shapes may be used in combination.

In FIGS. 7A to 7E, there is no particular limitation on a connection method of the chip 320 or the like provided with the signal processing circuit to the antenna 321 or the like, and a structure which can transmit and receive signals between the chip and the antenna may be used. FIG. 7A is given as an example, and a method in which the antenna 321 is connected to the chip 320 provided with the signal processing circuit by wire bonding connection or bump connection, or a method in which a part of the chip is made to function as an electrode and is attached to the antenna 321 may be employed. In this method, the chip 320 can be attached to the antenna 321 with the use of ACF (anisotropic conductive film). A structure in which the chip and the antenna are electrically connected to each other to enable transmission/reception of signals may be used. The length which is needed for the antenna depends on a frequency of signals which are received. For example, in the case where the frequency is 2.45 GHz, the length of antenna may be approximately 60 mm (½ wavelength) or approximately 30 mm (¼ wavelength).

The rectifier circuit 305 half-wave rectifies and smoothes signals received at the antenna 304.

The demodulation circuit 306 demodulates the AC electric signal converted by the rectifier circuit 305 and supplies the demodulation signal to the signal arithmetic portion 303.

The modulation circuit 307 applies load modulation to the antenna 304 based on the signals supplied from the signal arithmetic portion 303.

In the signal transmission/reception portion 301, a signal received at the antenna 304 is input to the rectifier circuit 305. An output signal from the rectifier circuit 305 is input to the demodulation circuit 306. An output signal from the demodulation circuit 306 is input to the signal arithmetic portion 303, and information on individual identification of the semiconductor device 300 is output to the modulation circuit 307. An output signal from the modulation circuit 307 is output to the reader/writer 314 outside through the antenna 304.

The signal intensity detection portion 302 includes the rectifier circuit 308, the power source circuit 309, and the ADC 310. The signal intensity detection portion 302 detects intensity of a signal received by the semiconductor device 300.

The signal arithmetic portion 303 includes a CPU 311, a RAM 312, and a ROM 313. The signal arithmetic portion 303 calculates a distance between the reader/writer and the semiconductor device 300 based on the intensity of the signal received by the semiconductor device 300. The signal transmission/reception portion 301 has a function to input the signal received by the semiconductor device 300 to the signal arithmetic portion 303 and read information on individual identification of the semiconductor device 300 from a storage circuit (such as the RAM 312 and the ROM 313) of the signal arithmetic portion 303 to transmit the information to the reader/writer; and a function to transmit to the reader/writer information on the distance between the reader/writer and the semiconductor device 300 calculated by the signal arithmetic portion 303.

In the signal intensity detection portion 302, a signal received at the antenna 304 in the signal transmission/reception portion 301 is input to the rectifier circuit 308. An output signal from the rectifier circuit 308 is input to the power source circuit 309. An output from the power source circuit 309 is input to the ADC 310. The output from the power source circuit 309 may also be supplied to each circuit of the semiconductor device 300 as electric power. The ADC 310 converts an analog signal output from the power source circuit 309 into a digital signal and outputs the digital signal to the signal arithmetic portion 303.

The signal arithmetic portion 303 includes the CPU (central processing unit) 311, the RAM (random access memory) 312, and the ROM (read only memory) 313. The signal arithmetic portion 303 includes the CPU 311 such as a logic circuit; the RAM 312, which is a work region (a region which temporarily stores information necessary for arithmetic processing); and the ROM 313, which stores program and the like used in the CPU 311. A volatile memory (typically, SRAM) is used as the RAM 312, and a nonvolatile memory (typically, EEPROM) is used as the ROM 313.

In the signal arithmetic portion 303, the distance between the reader/writer and the semiconductor device is calculated in accordance with the digital signal output from the ADC 310 of the signal intensity detection portion 302. In the signal arithmetic portion 303, calculation of the distance between the reader/writer and the semiconductor device may be processed using hardware or using both hardware and software, but is preferably processed using software. In a processing method using software, an arithmetic circuit is formed using the CPU 311, the RAM 312, and the ROM 313, and a distance calculation program is executed by the CPU 311. It is preferable to process using software since modification of a distance calculation method can be achieved by program modification and further, an occupation area of hardware in the semiconductor device 300 can be reduced. Note that data on the calculated distance is output to the reader/writer through the modulation circuit 307 and the antenna 304 in the signal transmission/reception portion 301.

By the semiconductor device having the above configuration, the distance between the reader/writer and the semiconductor device 300 can be calculated.

By applying the ADC of the present invention described in Embodiment Mode 1 to the ADC 310, various parameters which determine operation can be more freely set. Consequently, resolving power can be improved in the case of keeping a dynamic range. Alternatively, by lengthening a clock cycle for counting a discharging period, power consumption can be reduced. Further, it is not necessary to consider the offset voltage, so that the output period $T_2$ is not varied and digital data that is obtained can be more precise. Note that it is advantageous for the semiconductor device capable of wireless communication to reduce power consumption.

Embodiment Mode 3

Figure 8:
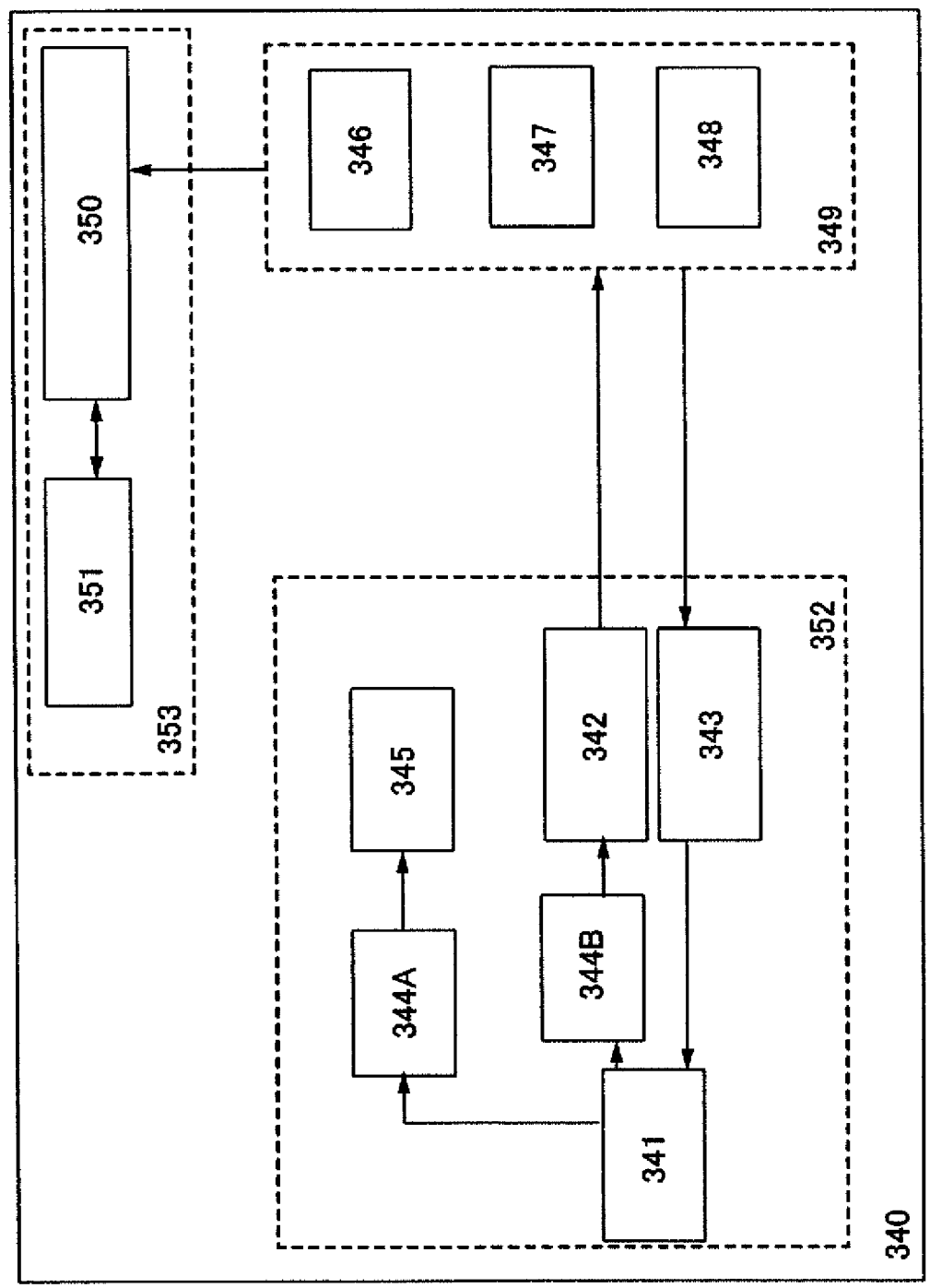
FIG. 8 is an explanatory diagram of a semiconductor device to which the present invention is applied.

This embodiment mode will describe a configuration of a sensor device having the ADC described in Embodiment Mode 1. Note that in this specification, also the sensor device is treated as one kind of so-called semiconductor devices. FIG. 8 is a block diagram showing a semiconductor device capable of wireless communication. The semiconductor device capable of wireless communication transmits and receives data to/from a reader/writer with radio signals.

FIG. 8 is a block diagram illustrating a configuration of a sensor device according to this embodiment mode. A sensor device 340 includes a signal arithmetic portion 349, a sensor portion 353, and a wireless communication portion 352.

The signal arithmetic portion 349 includes a CPU (central processing unit) 346, a RAM (random access memory) 347, and a ROM (read only memory) 348. That is, the signal arithmetic portion 349 includes the CPU 346 such as a logic circuit; the RAM 347, which is a work region (a region which temporarily stores information necessary for arithmetic processing); and the ROM 348, which stores program and the like used in the CPU 346. A volatile memory (typically, SRAM) is used as the RAM 347, and a nonvolatile memory (typically, EEPROM) is used as the ROM 348.

The wireless communication portion 352 includes an antenna 341, a rectifier circuit 344A, a rectifier circuit 344B, a power source circuit 345, a demodulation circuit 342, and a modulation circuit 343. The antenna 341 may employ an antenna similar to the antenna 304 illustrated in FIG. 6 and may be connected similarly to FIG. 6. The rectifier circuits 344A and 344B may employ a rectifier circuit similar to the rectifier circuit 308 illustrated in FIG. 6. The demodulation circuit 342 may employ a demodulation circuit similar to the demodulation circuit 306 illustrated in FIG. 6. The modulation circuit 343 may employ a modulation circuit similar to the modulation circuit 307 illustrated in FIG. 6.

In the sensor device 340 of this embodiment mode, an output from the power source circuit 345 is supplied to each circuit of the sensor device 340 as electric power. Note that the wireless communication portion 352 is not provided if not necessary.

The sensor portion 353 includes a sensor 351 and a sensor driving circuit 350.

Figure 9A:
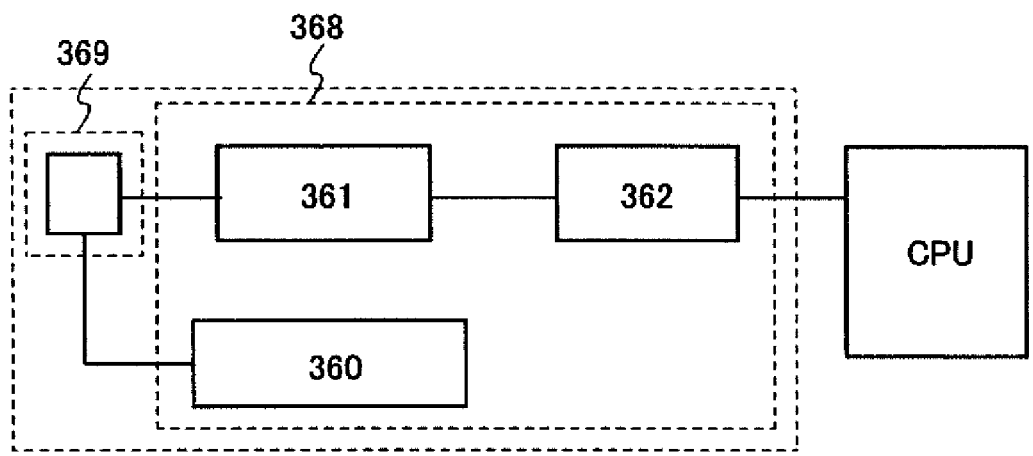
FIGS. 9A and 9B are explanatory diagrams of a semiconductor device to which the present invention is applied.

FIG. 9A illustrates an example of a sensor that detects surrounding brightness or the presence or absence of light. A sensor 369 is formed using a photodiode, a phototransistor, or the like. A sensor driving circuit 368 includes a sensor driving portion 360, a detecting portion 361, and an ADC 362.

Figure 9B:
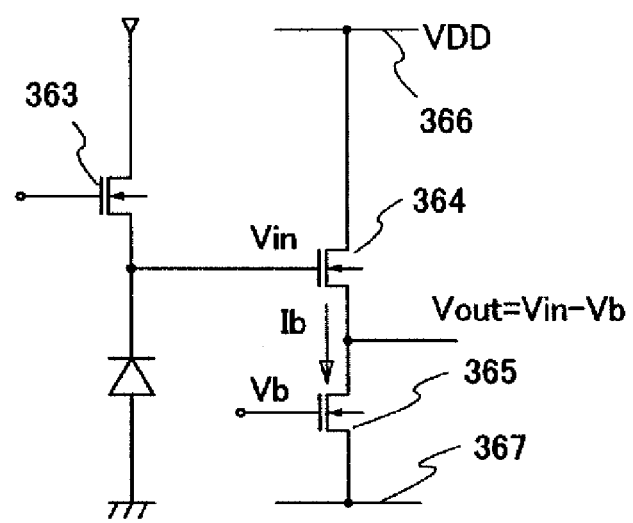

FIG. 9B is a circuit diagram illustrating the detecting portion 361. When a reset transistor 363 is made conducting, reverse bias voltage is applied to the sensor 369. Here, operation in which potential of a minus terminal of the sensor 369 is charged to the potential of power source voltage is referred to as "reset". After that, the reset transistor 363 is made non-conducting. At this time, the potential state is changed by an electromotive force of the sensor 369 with the passage of time. In other words, the potential of the minus terminal of the sensor 369 that has been charged to the potential of the power source voltage is gradually decreased by electric charge generated by photoelectric conversion. When a bias transistor 365 is made conducting state after a certain period of time has passed, a signal is output to an output side through an amplifying transistor 364. In this case, the amplifying transistor 364 and the bias transistor 365 operate as a so-called source follower circuit. Note that a plus terminal is electrically connected to ground potential.

In FIG. 9B, the example in which the source follower circuit is formed using an n-channel transistor is shown; however, it is needless to say that the source follower circuit can also be formed using a p-channel transistor. Power source voltage $V_{DD}$ is applied to an amplifying side power source line 366. Reference Potential is applied to a bias side power source line 367. A drain electrode of the amplifying transistor 364 is connected to the amplifying side power source line 366, and a source electrode is connected to a drain electrode of the bias transistor 365.

A source electrode of the bias transistor 365 is connected to the bias side power source line 367. Bias voltage $V_b$ is applied to a gate electrode of the bias transistor 365 and bias current $I_b$ flows through this transistor. The bias transistor 365 basically operates as a constant current source. Input potential $V_{in}$ is applied to a gate electrode of the amplifying transistor 364, and the source electrode is connected to an output terminal. The input-output relationship of this source follower circuit is defined as $V_{out}=V_{in}-V_b$ by equalizing the sizes of the amplifying transistor 364 and the bias transistor 365. This output voltage $V_{out}$ is converted into a digital signal by the ADC 362. The digital signal is output to the CPU 346.

The sensor and the sensor driving circuit can be achieved using the ADC 362. The ADC of the present invention described in Embodiment Mode 1 can be applied to the ADC 362. By applying the ADC of the present invention to the ADC 362, various parameters which determine operation can be more freely set. Consequently, resolving power can be improved in the case of keeping a dynamic range. Alternatively, by lengthening a clock cycle for counting a discharging period, power consumption can be reduced. Further, it is not necessary to consider the offset voltage, so that the output period $T_2$ is not varied and digital data that is obtained can be more precise.

Embodiment Mode 4

This embodiment mode will describe a semiconductor device capable of wireless communication (referred to as an IC tag, an RF tag, or the like) having a configuration in which a power source is monitored by the integration type ADC of the present invention. The semiconductor device capable of wireless communication is a small-sized semiconductor device in which an element formation layer and an antenna layer are combined. As an application field of the semiconductor device capable of wireless communication, for example, merchandise management in the distribution industry can be given. In general, the semiconductor devices capable of wireless communication are roughly classified into an active type with a built-in power storage portion and a passive type which operates using an external energy source. Since even the active type has a limit on the capacity of the power storage portion, it is necessary to operate the semiconductor device with a limited power source. Under such a condition, it is useful to monitor the power source with the ADC.

Figure 10:
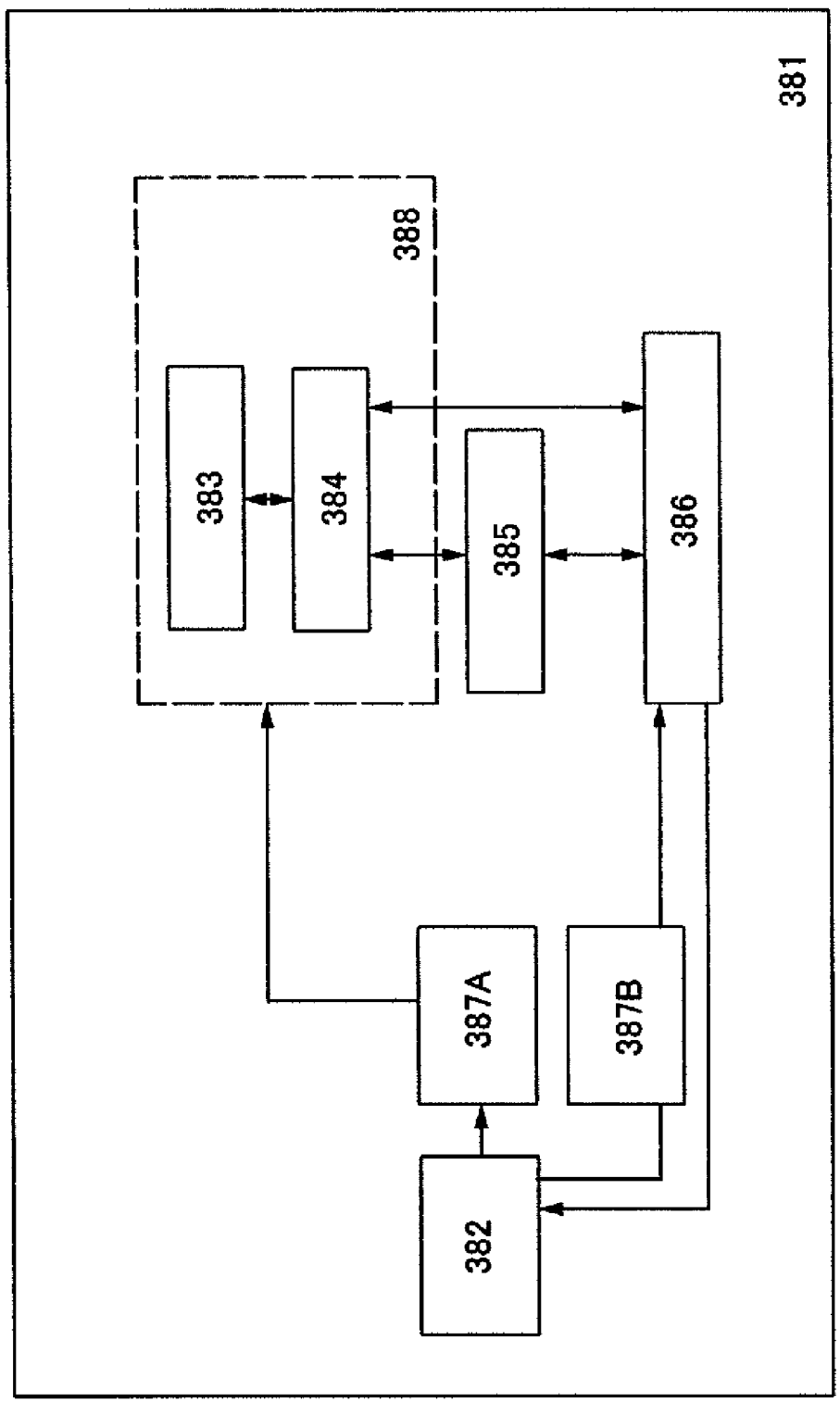
FIG. 10 is an explanatory diagram of a semiconductor device to which the present invention is applied.

FIG. 10 is a block diagram illustrating a semiconductor device 381 capable of wireless communication of this embodiment mode. The semiconductor device 381 includes an antenna 382, an ADC 385, a signal processing portion 386, and a power source portion 388. The power source portion 388 includes a power storage portion 383 and a power source circuit 384.

The antenna 382 can employ an antenna similar to the antenna 304 of Embodiment Mode 2.

A rectifier circuit 387A and a rectifier circuit 387B half-wave rectify and smooth signals received at the antenna 382.

The ADC 385 can employ the ADC described in Embodiment Mode 1.

The power source portion 388 supplies electric power to each circuit included in the semiconductor device 381.

The signal processing portion 386 includes a modulation circuit, a demodulation circuit, a CPU, a ROM, a RAM, and the like.

A signal received at the antenna 382 is transmitted to the power source portion 388 through the rectifier circuit 387A and supplied as electric power. The electric power supplied to the power storage portion 383 is stored as storage power. The power storage portion 383 has a function of storing electric power and corresponds to a battery and the like.

Note that a battery refers to a battery whose continuous operating time can be restored by charging. A battery formed in a sheet-like form is preferably used. For example, reduction in size is possible with the use of a lithium battery, preferably a lithium polymer battery that uses a gel electrolyte, a lithium ion battery, or the like. It is needless to say that the battery is not limited to these as long as it can be charged, and a battery that can be charged and discharged, such as a nickel metal hydride battery or a nickel cadmium battery, may be used. Alternatively, a high-capacity capacitor or the like may be used.

The storage power is supplied to the ADC 385 and the signal processing portion 386 through the power source circuit 384 as power source voltage. The ADC 385 has a function of monitoring power source voltage and can employ the ADC described in Embodiment Mode 1. A monitoring result of the power source voltage (power source data) is sent from the ADC 385 to the signal processing portion 386. The signal processing portion 386 dynamically controls its operation based on the power source data and feeds the data back to the power source circuit 384 so as to control the power source voltage supplied to the signal processing portion 386. In this manner, control in accordance with operation conditions of the semiconductor device 381 is performed as appropriate.

Meanwhile, a signal received is transmitted to the signal processing portion 386 through the antenna 382 and demodulated (a demodulation signal is generated). Next, in the signal processing portion 386, a response signal in accordance with the demodulation signal is generated and modulated (a modulation signal is generated). The modulation signal is transmitted to the outside through the antenna 382 (a transmission signal is output). In this manner, the semiconductor device 381 can function as a wireless communication device.

Data expressed by the transmission signal is to be determined in accordance with the application use of the semiconductor device 381. For example, the power source data as described above may be included. Further, when the semiconductor device 381 generates the transmission signal with electric power stored in the power storage portion 383 as an energy source not in accordance with the reception signal, the semiconductor device 381 can function as a sensor which can voluntarily notify of change.

With the above configuration, a semiconductor device which can be controlled as appropriate can be provided. It is advantageous to apply the integration type ADC of the present invention to such a semiconductor device in terms of circuit size and power consumption.

Although this embodiment mode describes the semiconductor device capable of wireless communication using the integration type ADC of the present invention, the integration type ADC of the present invention can also be applied to general portable devices which are operated without an external power source.

This embodiment mode can be freely combined with Embodiment Modes 1 to 3.

Embodiment Mode 5

In this embodiment mode, an example of a method for manufacturing the ADC described in Embodiment Mode 1 and a semiconductor device having the ADC will be described with reference to the drawings. In this embodiment mode, a structure in which an antenna, a battery, and a signal processing circuit in a semiconductor device are provided over the same substrate, using thin film transistors, will be described. Note that when the antenna, the battery, and the signal processing circuit are formed over the same substrate, miniaturization can be achieved. In addition, an example in which a thin film secondary battery is used for the battery will be described.

First, a separation layer 403 is formed over one surface of a substrate 401 with an insulating film 402 therebetween. Next, an insulating film 404 which serves as a base film and an amorphous semiconductor film 405 (e.g., a film which includes amorphous silicon) are stacked (FIG. 12A). Note that the insulating film 402, the separation layer 403, the insulating film 404, and the amorphous semiconductor film 405 can be formed in succession. The separation layer 403 is not necessarily formed when separation is not needed.

The substrate 401 may be a glass substrate, a quartz substrate, a metal substrate (e.g., a ceramic substrate, a stainless steel substrate, or the like), a semiconductor substrate such as a Si substrate, or the like. Alternatively, a plastic substrate such as a substrate formed of polyethylene terephthalate (PET), polyethylene naphthalate (PEN), polyether sulfone (PES), acrylic, or the like can be used. Note that in this process, the separation layer 403 is provided over the entire surface of the substrate 401 with the insulating film 402 interposed therebetween; however, if necessary, after the separation layer is provided over the entire surface of the substrate 401, the separation layer may be patterned by using a photolithography method.

The insulating film 402 and the insulating film 404 are formed using an insulating material such as silicon oxide, silicon nitride, silicon oxynitride ($SiO_xN_y$, where x>y>0), or silicon nitride oxide ($SiN_xO_y$, where x>y>0), by a CVD method, a sputtering method, or the like. For example, when the insulating film 402 and the insulating film 404 have a two-layer stacked structure, preferably, a silicon nitride oxide film is formed as a first insulating film and a silicon oxynitride film is formed as a second insulating film. Alternatively, a silicon nitride film may be formed as a first insulating film and a silicon oxide film may be formed as a second insulating film. The insulating film 402 serves as a blocking layer which prevents an impurity element from the substrate 401 from being mixed into the separation layer 403 or an element formed thereover. The insulating film 404 serves as a blocking layer which prevents an impurity element from the substrate 401 and the separation layer 403 from being mixed into an element formed thereover. By forming the insulating films 402 and 404 which serve as blocking layers in this manner, an element formed thereover can be prevented from being adversely affected by an alkali metal such as sodium or an alkaline earth metal included in the substrate 401, and an impurity element included in the separation layer 403. Note that when quartz is used as the substrate 401, the insulating films 402 and 404 may be omitted. This is because a quartz substrate does not include an alkali metal or an alkaline earth metal.

As the separation layer 403, a metal film, a stacked-layer structure including a metal film and a metal oxide film, or the like can be used. As the metal film, a single-layer structure or a stacked-layer structure is formed using a film formed of tungsten, molybdenum, titanium, tantalum, niobium, nickel, cobalt, zirconium, zinc, ruthenium, rhodium, palladium, osmium, or iridium, or of an alloy material or a compound material containing such an element as its main component. These materials can be formed by a sputtering method, various CVD methods such as a plasma CVD method, or the like. The stacked-layer structure including a metal film and a metal oxide film is formed as follows: after the aforementioned metal film is formed, plasma treatment in an oxygen atmosphere or an $N_2O$ atmosphere, or heat treatment in an oxygen atmosphere or an $N_2O$ atmosphere is performed, so that an oxide or an oxynitride of the metal film is formed on the surface of the metal film. For example, when a tungsten film is formed as the metal film by a sputtering method, a CVD method, or the like, plasma treatment is performed on the tungsten film so that a metal oxide film formed of tungsten oxide can be formed on the surface of the tungsten film. Alternatively, for example, after a metal film (e.g., a tungsten film) is formed, an insulating film may be formed over the metal film using silicon oxide ($SiO_2$) or the like by a sputtering method, whereby a metal oxide film may be formed on the metal film (e.g., a tungsten oxide film on the tungsten film). Further, for example, high-density plasma treatment as described above may be performed as plasma treatment. Furthermore, in addition to the metal oxide film, a metal nitride or a metal oxynitride may be used. In this case, the metal film may be subjected to plasma treatment or heat treatment in a nitrogen atmosphere or an atmosphere where nitrogen and oxygen are mixed.

The amorphous semiconductor film 405 is formed with a thickness of 10 nm to 200 nm, inclusive (preferably, 30 nm to 150 nm, inclusive) by a sputtering method, an LPCVD method, a plasma CVD method, or the like.

Next, the amorphous semiconductor film 405 is crystallized by being irradiated with a laser beam. The amorphous semiconductor film 405 may be crystallized by a method which combines laser beam irradiation with a thermal crystallization method which employs RTA (rapid thermal annealing) or an annealing furnace or a thermal crystallization method which employs a metal element for promoting crystallization, or the like. Then, the obtained crystalline semiconductor film is etched into a desired shape to form crystalline semiconductor films 405a to 405f, and a gate insulating film 406 is formed so as to cover the crystalline semiconductor films 405a to 405f (FIG. 12B). Note that the etching is preferably performed so that end portions of the crystalline semiconductor films have a tapered shape. With a tapered shape, the gate insulating film can be formed favorably.

Note that the gate insulating film 406 is formed using an insulating material such as silicon oxide, silicon nitride, silicon oxynitride ($SiO_xN_y$, where $x>y>0$), or silicon nitride oxide ($SiN_xO_y$, where $x>y>0$), by a CVD method, a sputtering method, or the like. For example, when the gate insulating film 406 has a two-layer stacked structure, preferably, a silicon oxynitride film is formed as a first insulating film and a silicon nitride oxide film is formed as a second insulating film. Alternatively, a silicon oxide film may be formed as the first insulating film and a silicon nitride film may be formed as the second insulating film.

Next, an example of a manufacturing step of the crystalline semiconductor films 405a to 405f is briefly described below. First, an amorphous semiconductor film with a thickness of 50 nm to 60 nm is formed by a plasma CVD method. Next, a solution containing nickel, which is a metal element for promoting crystallization, is retained on the amorphous semiconductor film, and then dehydrogenation treatment (at 500° C., for one hour) and thermal crystallization treatment (at 550° C., for four hours) are performed on the amorphous semiconductor film to form a crystalline semiconductor film. Then, the crystalline semiconductor film is irradiated with a laser beam, and the crystalline semiconductor films 405a to 405f are formed by etching using a photolithography method. Note that the amorphous semiconductor film may be crystallized just by laser beam irradiation, without performing thermal crystallization which employs a metal element for promoting crystallization. Note that the present invention is not limited to the above polycrystalline semiconductor film but a single crystal semiconductor film may also be used.

As a laser oscillator for crystallization, a continuous wave laser beam (a CW laser beam) or a pulsed wave laser beam (a pulsed laser beam) can be used. As a laser beam which can be used here, a laser beam emitted from one or more of the following can be used: a gas laser, such as an Ar laser, a Kr laser, or an excimer laser; a laser whose medium is single-crystal YAG, $YVO_4$, forsterite ($Mg_2SiO_4$), $YAlO_3$, or $GdVO_4$, to which one or more of Nd, Yb, Cr, Ti, Ho, Er, Tm, and Ta has been added as a dopant, or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta has been added as a dopant; a glass laser; a ruby laser; an alexandrite laser; a Ti:sapphire laser; a copper vapor laser; and a gold vapor laser. Crystals with a large grain size can be obtained by irradiation with fundamental waves of such laser beams or second to fourth harmonics of the fundamental waves. For example, the second harmonic (532 nm) or the third harmonic (355 nm) of an Nd:$YVO_4$ laser (fundamental wave of 1064 nm) can be used. In this case, a power density of approximately 0.01 to 100 $MW/cm^2$ (preferably, 0.1 to 10 $MW/cm^2$, inclusive) is necessary. Irradiation is conducted with a scanning rate of approximately 10 to 2000 cm/sec. Note that a beam of a laser using, as a medium, single-crystal YAG, $YvO_4$, forsterite ($Mg_2SiO_4$), $YAlO_3$, or $GdVO_4$, to which one or more of Nd, Yb, Cr, Ti, Ho, Er, Tm, and Ta has been added as a dopant, or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta has been added as a dopant; an Ar ion laser; or a Ti:sapphire laser, can be continuously emitted. Furthermore, pulse oscillation thereof can be performed at a repetition rate of greater than or equal to 10 MHz by performing Q-switch operation, mode locking, or the like. When a laser beam is emitted at a repetition rate of greater than or equal to 10 MHz, during the time in which a semiconductor film melts by the laser beam and then solidifies, the semiconductor film is irradiated with a beam of the next pulse. Accordingly, unlike in the case of using a pulsed laser with a low repetition rate, a solid-liquid interface can be continuously moved in the semiconductor film; therefore, crystal grains which have grown continuously in a scanning direction can be obtained.

Further, the foregoing high-density plasma treatment may be performed on the crystalline semiconductor films 405a to 405f to oxidize or nitride the surfaces thereof, to form the gate insulating film 406. For example, the gate insulating film 406 is formed by a plasma treatment in which a mixed gas which contains a rare gas such as He, Ar, Kr, or Xe, and oxygen, nitrogen oxide, ammonia, nitrogen, hydrogen, or the like, is introduced. When excitation of the plasma in this case is performed by introduction of a microwave, high-density plasma with a low electron temperature can be generated. The surface of the semiconductor film can be oxidized or nitrided by oxygen radicals (OH radicals may be included) or nitrogen radicals (NH radicals may be included) generated by this high-density plasma.

By treatment using such high-density plasma, an insulating film with a thickness of 1 nm to 20 nm, inclusive, typically 5 nm to 10 nm, inclusive is formed over the semiconductor film. Because the reaction in this case is a solid-phase reaction, interface state density between the insulating film and the semiconductor film can be made very low. Because such high-density plasma treatment oxidizes (or nitrides) the semiconductor film (crystalline silicon or polycrystalline silicon) directly, the insulating film can be formed, ideally, with very little unevenness in its thickness. In addition, since crystal grain boundaries of crystalline silicon are not strongly oxidized either, very favorable conditions result. That is, by the solid-phase oxidation of the surface of the semiconductor film by the high-density plasma treatment shown here, an insulating film with good uniformity and low interface state density can be formed without excessive oxidation at crystal grain boundaries.

Note that as the gate insulating film 406, just an insulating film formed by the high-density plasma treatment may be used, or an insulating film of silicon oxide, silicon oxynitride, silicon nitride, or the like may be stacked thereover by a CVD method which employs plasma or a thermal reaction. In any case, when transistors include an insulating film formed by high-density plasma in a part of a gate insulating film or in the whole of a gate insulating film, unevenness in characteristics can be reduced.

Furthermore, in the crystalline semiconductor films 405a to 405f which are obtained by crystallizing the semiconductor film by irradiation with a continuous wave laser beam or a laser beam emitted at a repetition rate of greater than or equal to 10 MHz which is scanned in one direction, crystals can grow in the scanning direction of the laser beam. When transistors are disposed so that the scanning direction is aligned with the channel length direction (the direction in which a carrier flows when a channel formation region is formed) and the above-described gate insulating layer is used in combination with the transistors, thin film transistors with less variation in characteristics and high electric field-effect mobility can be obtained.

Next, a first conductive film and a second conductive film are stacked over the gate insulating film 406. In this embodiment mode, the first conductive film is formed with a thickness of 20 nm to 100 nm, inclusive, using a CVD method, a sputtering method, or the like. The second conductive film is formed with a thickness of 100 nm to 400 nm, inclusive. The first conductive film and the second conductive film are formed using an element such as tantalum, tungsten, titanium, molybdenum, aluminum, copper, chromium, or niobium, or using an alloy material or a compound material containing such an element as its main component. Alternatively, they are formed using a semiconductor material such as polycrystalline silicon having conductivity by being doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Because tungsten and tantalum nitride have high heat resistance, heat treatment for thermal activation can be performed after the first conductive film and the second conductive film are formed. In addition, in the case of using a three-layer stacked structure instead of a two-layer stacked structure, a stacked-layer structure in which an aluminum film is interposed between molybdenum films may be used.

Next, a resist mask is formed using a photolithography method, and etching treatment for forming a gate electrode and a gate line is conducted, to form gate electrodes 407 over the crystalline semiconductor films 405a to 405f. In this embodiment mode, an example in which the gate electrodes 407 have a stacked-layer structure which includes a first conductive film 407a and a second conductive film 407b is described.

Next, the gate electrodes 407 are used as masks, and an impurity element imparting n-type conductivity is added to the crystalline semiconductor films 405a to 405f at a low concentration by an ion doping method or an ion implantation method. Then, a resist mask is selectively formed by a photolithography method, and an impurity element imparting p-type conductivity is added at a high concentration. As an impurity element which exhibits n-type conductivity, phosphorus, arsenic, or the like can be used. As an impurity element which exhibits p-type conductivity, boron, aluminum, gallium, or the like can be used. Here, phosphorus is used as an impurity element which imparts n-type conductivity, and is selectively introduced into the crystalline semiconductor films 405a to 405f such that they contain phosphorus at a concentration of $1\times10^{15}$ to $1\times10^{19}/cm^3$. Thus, n-type impurity regions 408 are formed. Further, boron is used as an impurity element which imparts p-type conductivity, and is selectively introduced into the crystalline semiconductor films 405c and 405e such that they contain boron at a concentration of $1\times10^{19}$ to $1\times10^{20}/cm^3$. Thus, p-type impurity regions 409 are formed (FIG. 12C).

Next, an insulating film is formed so as to cover the gate insulating film 406 and the gate electrodes 407. The insulating film is formed as a single layer or stacked layers using a film containing an inorganic material such as silicon, an oxide of silicon, or a nitride of silicon, or a film containing an organic material such as an organic resin, by a plasma CVD method, a sputtering method, or the like. Next, the insulating film is selectively etched using anisotropic etching which etches mainly in a perpendicular direction, to form insulating films 410 (also referred to as side walls) which are in contact with the side surfaces of the gate electrodes 407. The insulating films 410 are used as masks for doping when LDD (lightly doped drain) regions are formed.

Next, using a resist mask formed by a photolithography method, the gate electrodes 407, and the insulating films 410 as masks, an impurity element which imparts n-type conductivity is added at a high concentration to the crystalline semiconductor films 405a, 405b, 405d, and 405f, to form n-type impurity regions 411. Here, phosphorus is used as an impurity element which imparts n-type conductivity, and it is selectively introduced into the crystalline semiconductor films 405a, 405b, 405d, and 405f such that they contain phosphorus at a concentration of $1\times10^{19}$ to $1\times10^{20}/cm^3$. Thus, the n-type impurity regions 411, which have a higher concentration than the impurity regions 408, are formed.

By the foregoing steps, n-channel thin film transistors 400a, 400b, 400d, and 400f, and p-channel thin film transistors 400c and 400e are formed (FIG. 12D).

In the n-channel thin film transistor 400a, a channel formation region is formed in a region of the crystalline semiconductor film 405a which overlaps with the gate electrode 407; the impurity regions 411 which each form either a source region or a drain region are formed in regions which do not overlap with the gate electrode 407 and the insulating films 410; and lightly doped drain regions (LDD regions) are formed in regions which overlap with the insulating films 410 and which are between the channel formation region and the impurity regions 411. Further, the n-channel thin film transistors 400b, 400d, and 400f are similarly provided with channel formation regions, lightly doped drain regions, and impurity regions 411.

In the p-channel thin film transistor 400c, a channel formation region is formed in a region of the crystalline semiconductor film 405c which overlaps with the gate electrode 407, and the impurity regions 409 which each form either a source region or a drain region are formed in regions which do not overlap with the gate electrode 407. Further, the p-channel thin film transistor 400e is similarly provided with a channel formation region and the impurity regions 409. Note that here, the p-channel thin film transistors 400c and 400e are not provided with LDD regions; however, the p-channel thin film transistors may be provided with an LDD region, and the n-channel thin film transistor may not be provided with an LDD region.

Next, an insulating film is formed as a single layer or stacked layers so as to cover the crystalline semiconductor films 405a to 405f, the gate electrodes 407, and the like; and conductive films 413, which are electrically connected to the impurity regions 409 and 411 which form the source regions and the drain regions of the thin film transistors 400a to 400f, are formed over the insulating film (FIG. 13A). The insulating film is formed as a single layer or stacked layers, using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. Here, the insulating film has a two-layer structure. A silicon nitride oxide film is formed as a first insulating film 412a, and a silicon oxynitride film is formed as a second insulating film 412b. Further, the conductive films 413 can form source electrodes and drain electrodes of the thin film transistors 400a to 400f.

Note that before the insulating films 412a and 412b are formed or after one or more thin films of the insulating films 412a and 412b are formed, heat treatment is preferably conducted for recovering the crystallinity of the semiconductor film, for activating an impurity element which has been added to the semiconductor film, or for hydrogenating the semiconductor film. As the heat treatment, a thermal annealing method, a laser annealing method, an RTA method, or the like is preferably used.

The conductive films 413 are formed as a single layer or stacked layers, using an element such as aluminum, tungsten, titanium, tantalum, molybdenum, nickel, platinum, copper, gold, silver, manganese, neodymium, carbon, or silicon, or an alloy material or a compound material containing the element as its main component, by a CVD method, a sputtering method, or the like. An alloy material containing aluminum as its main component corresponds to, for example, a material which contains aluminum as its main component and also contains nickel, or an alloy material which contains aluminum as its main component and which also contains nickel and one or both of carbon and silicon. As for the stacked layer, the conductive films 413 preferably employ, for example, a stacked-layer structure including a barrier film, an aluminum-silicon film, and a barrier film, or a stacked-layer structure including a barrier film, an aluminum-silicon film, a titanium nitride film, and a barrier film. Note that a barrier film is provided by using a thin film formed from titanium, a nitride of titanium, molybdenum, or a nitride of molybdenum. Aluminum and aluminum silicon, which have low resistance and are inexpensive, are ideal materials for forming the conductive films 413. Further, generation of hillocks of aluminum or aluminum silicon can be prevented when upper and lower barrier layers are formed. Furthermore, when the barrier film is formed from titanium, which is a highly-reducible element, even if a thin natural oxide film is formed over the semiconductor film, the natural oxide film can reduced and removed, so good contact with the semiconductor film can be obtained.

Next, an insulating film 414 is formed so as to cover the conductive films 413, and over the insulating film 414, conductive films 415a and 415b, which are each electrically connected to the conductive film 413 which forms a source electrode or a drain electrode of the thin film transistors 400a and 400f, are formed. Further, a conductive film 416, which is electrically connected to the conductive film 413 which forms a source electrode or a drain electrode of the thin film transistor 400b, is formed. Note that the conductive films 415a, 415b, and 416 may be formed of the same material in the same step. The conductive films 415a and 415b and the conductive film 416 can be formed using any of the materials that the conductive films 413 can be formed of, mentioned above.

Then, a conductive film 417 that serves as an antenna is formed so as to be electrically connected to the conductive film 416 (FIG. 13B).

The insulating film 414 can be provided by a CVD method, a sputtering method, or the like as a single-layer or stacked layers using an insulating film containing oxygen and/or nitrogen, such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (diamond-like carbon); an organic material such as epoxy, polyimide, polyamide, polyvinyl phenol, benzocyclobutene, or acrylic; or a siloxane material such as a siloxane resin. Note that a siloxane material corresponds to a material having a Si—O—Si bond. Siloxane has a skeleton structure formed of bonds of silicon and oxygen. As a substituent, an organic group containing at least hydrogen (for example, an alkyl group or aromatic hydrocarbon) is given. A fluoro group can also be given as a substituent. Alternatively, an organic group containing at least hydrogen and a fluoro group may be given as a substituent.

The conductive film 417 is formed from a conductive material using a CVD method, a sputtering method, a printing method, such as a screen printing method or a gravure printing method, a droplet discharging method, a dispensing method, a plating method, or the like. The conductive material is any of the elements of aluminum, titanium, silver, copper, gold, platinum, nickel, palladium, tantalum, and molybdenum, or an alloy material or a compound material containing the elements as its main component, and has a single-layer structure or a stacked-layer structure.

For example, in the case of using a screen printing method to form the conductive film 417 which serves as an antenna, the conductive film 417 can be provided by selectively printing a conductive paste in which conductive particles having a grain size of several nm to several tens of μm are dissolved or dispersed in an organic resin. As conductive particles, metal particles of one or more of any of silver, gold, copper, nickel, platinum, palladium, tantalum, molybdenum, titanium, and the like; fine particles of silver halide; or dispersive nanoparticles can be used. In addition, as the organic resin included in the conductive paste, one or more organic resins selected from organic resins which serve as a binder, a solvent, a dispersing agent, and a coating material for the metal particles can be used. An organic resin such as an epoxy resin or a silicon resin can be given as representative examples. Further, when the conductive film is formed, it is preferable to conduct baking after the conductive paste is applied. For example, in the case of using fine particles containing silver as a main component (e.g., the grain size is 1 nm to 100 nm, inclusive) as a material for the conductive paste, the conductive film can be obtained by curing by baking at a temperature in the range of 150° C. to 300° C. Alternatively, fine particles containing solder or lead-free solder as a main component may be used. In that case, preferably, fine particles having a grain size of less than or equal to 20 μm are used. Solder and lead-free solder have advantages such as low cost.

Further, the conductive films 415a and 415b can each serve as a wiring which is electrically connected to a secondary battery included in the semiconductor device of the present invention in a subsequent process. Furthermore, when the conductive film 417 which serves as an antenna is formed, another conductive film may be separately formed such that it is electrically connected to the conductive films 415a and 415b, and that conductive film may be used as a wiring connected to the secondary battery.

Next, an insulating film 418 is formed so as to cover the conductive film 417, and then a layer (hereinafter referred to as an element formation layer 419) including the thin film transistors 400a to 400f, the conductive film 417, and the like, is separated from the substrate 401. Here, after using laser beam (e.g., UV light) irradiation to form openings in regions where the thin film transistors 400a to 400f are not formed (FIG. 13C), the element formation layer 419 can be separated from the substrate 401 using physical force. Alternatively, before the element formation layer 419 is separated from the substrate 401, an etchant may be introduced into the formed openings to selectively remove the separation layer 403. As the etchant, a gas or liquid containing halogen fluoride or an interhalogen compound is used. For example, chlorine trifluoride is used as a gas containing halogen fluoride. Accordingly, the element formation layer 419 is separated from the substrate 401. Note that the separation layer 403 may be partially left instead of being removed entirely. By removing the separation layer 403 while leaving a part thereof, consumption of the etchant and treatment time required for removing the separation layer can be reduced. Accordingly, throughput is improved and cost is reduced. Further, the element formation layer 419 can be retained over the substrate 401 after the separation layer 403 is removed. Furthermore, by reusing the substrate 401 which is separated, cost can be reduced.

The insulating film 418 can be formed by a CVD method, a sputtering method, or the like as a single-layer structure or a stacked-layer structure using an insulating film which contains oxygen and/or nitrogen, such as silicon oxide ($SiO_x$), silicon nitride ($SiN_x$), silicon oxynitride ($SiO_xN_y$ where x>y), or silicon nitride oxide ($SiN_xO_y$ where x>y); a film containing carbon such as DLC (diamond-like carbon); a film containing an organic material such as epoxy, polyimide, polyamide, polyvinyl phenol, benzocyclobutene, or acrylic; or a film containing a siloxane material such as a siloxane resin.

Figure 14A:
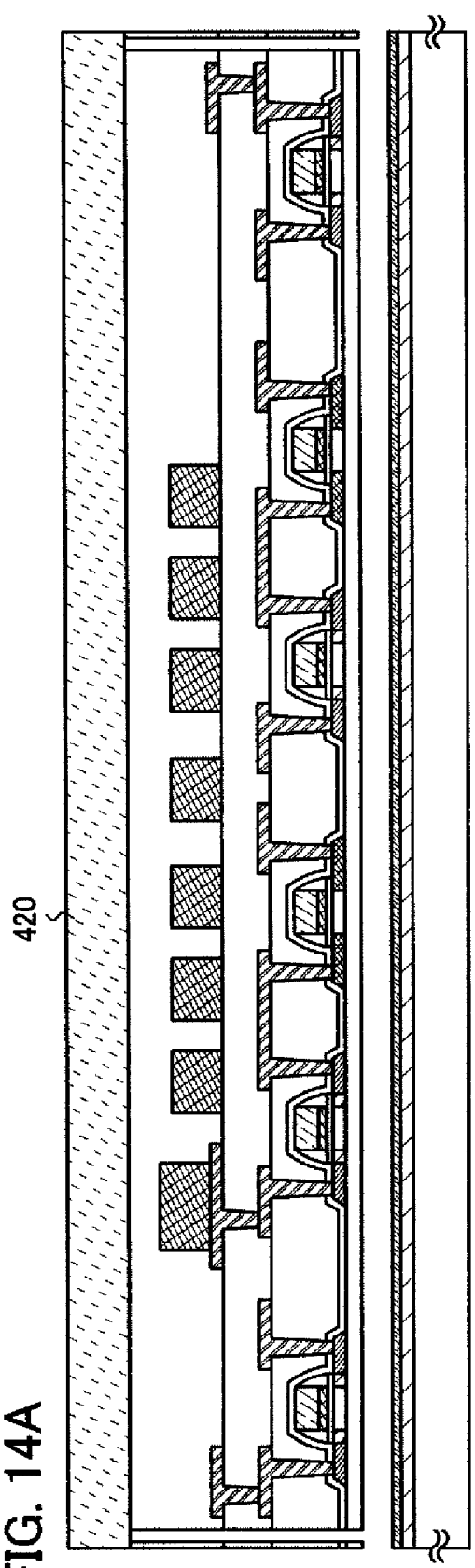
FIGS. 14A and 14B are explanatory views of a manufacturing method of a semiconductor device to which the present invention is applied.

In this embodiment mode, the openings are formed in the element formation layer 419 by laser beam irradiation, and then a first sheet material 420 is attached to one surface of the element formation layer 419 (a surface where the insulating film 418 is exposed). Then, the element formation layer 419 is separated from the substrate 401 (FIG. 14A).

Figure 14B:
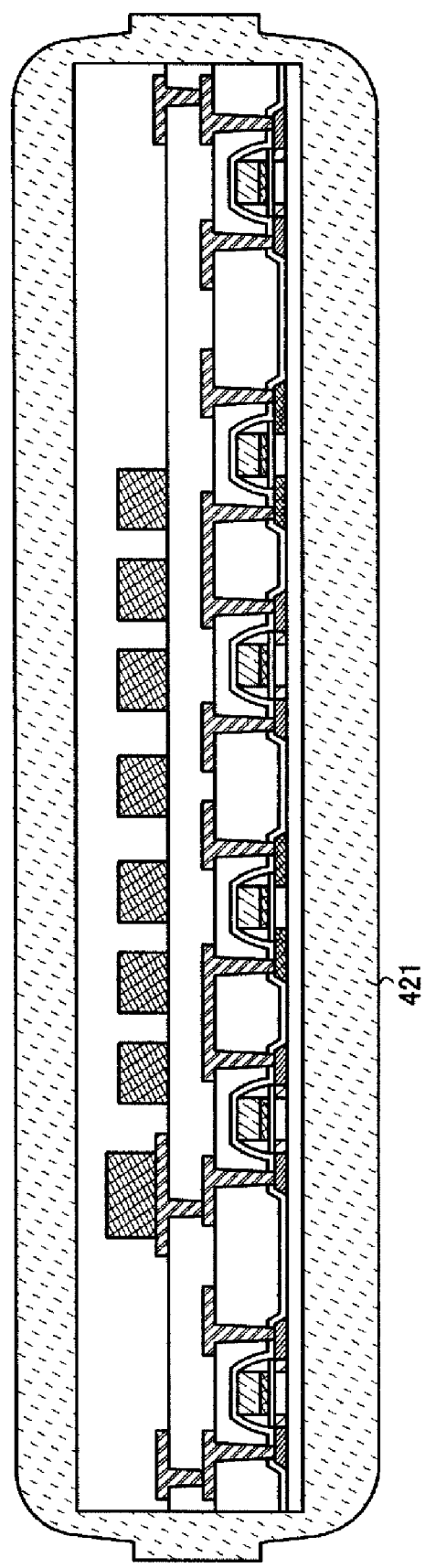

Next, after attaching a second sheet material 421 to the other surface of the element formation layer 419 (a surface exposed by separation), the first sheet material 420 and the second sheet material 421 are attached together by performing one or both of heat treatment and pressure treatment (FIG. 14B). As the first sheet material 420 and the second sheet material 421, a hot-melt film or the like can be used.

As the first sheet material 420 and the second sheet material 421, films on which antistatic treatment for preventing static electricity or the like has been performed (hereinafter referred to as antistatic films) can be used. Examples of antistatic films are films in which an antistatic material is dispersed in a resin, films to which an antistatic material is attached, and the like. A film provided with an antistatic material may be a film which has an antistatic material provided over one of its surfaces, or a film which has antistatic materials provided over both of its surfaces. Concerning the film which has an antistatic material provided over one of its surfaces, the film may be attached to the layer such that the antistatic material is on the inner side of the film or the outer side of the film. Note that the antistatic material may be provided over the entire surface of the film, or over a part of the film. As an antistatic material, a conductive material such as a metal, indium tin oxide (ITO), or a surfactant such as an amphoteric surfactant, a cationic surfactant, or a nonionic surfactant can be used. In addition to that, as an antistatic material, a resin material containing a cross-linked copolymer having a carboxyl group and a quaternary ammonium base on its side chain, or the like can be used. By attaching, mixing, or applying such a material to a film, an antistatic film can be formed. By performing sealing using the antistatic film, a semiconductor element can be prevented from being adversely affected by static electricity from outside and the like when dealt with as a product.

Note that a storage capacitor of a power source circuit is formed such that a thin film secondary battery is connected to the conductive films 415a and 415b. The connection with the secondary battery may be made before the element formation layer 419 is separated from the substrate 401 (at a stage shown in FIG. 13B or FIG. 13C), after the element formation layer 419 is separated from the substrate 401 (at a stage shown in FIG. 14A), or after the element formation layer 419 is sealed with the first sheet material and the second sheet material (at a stage shown in FIG. 14B). An example of the structure in which the element formation layer 419 and the secondary battery are connected to each other is described below with reference to FIGS. 15A to 16B.

In FIG. 13B, conductive films 431a and 431b, which are electrically connected to the conductive films 415a and 415b, respectively, are formed at the same time as the conductive film 417 which serves as an antenna. Next, the insulating film 418 is formed so as to cover the conductive film 417 and the conductive films 431a and 431b. Then, openings 432a and 432b are formed so as to expose the surfaces of the conductive films 431a and 431b. Then, after the openings are formed in the element formation layer 419 by laser beam irradiation, the first sheet material 420 is attached to one surface of the element formation layer 419 (the surface where the insulating film 418 is exposed); and then, the element formation layer 419 is separated from the substrate 401 (FIG. 15A).

Next, the second sheet material 421 is attached to the other surface (a surface exposed by separation) of the element formation layer 419, and the element formation layer 419 is then separated from the first sheet material 420. Accordingly, in this embodiment mode, a sheet material with weak adhesion is used as the first sheet material 420. Then, conductive films 434a and 434b, which are electrically connected to the conductive films 431a and 431b, respectively, through the openings 432a and 432b, are selectively formed (FIG. 15B).

The conductive film 434a and the conductive film 434b are formed of a conductive material using a CVD method, a sputtering method, a printing method such as a screen printing method or a gravure printing method, a droplet discharging method, a dispensing method, a plating method, or the like. The conductive material is any of the elements of aluminum, titanium, silver, copper, gold, platinum, nickel, palladium, tantalum, and molybdenum, or an alloy material or a compound material containing the elements as its main component, and has a single-layer structure or a stacked-layer structure.

Note that in this embodiment mode, an example in which the conductive films 434a and 434b are formed after the element formation layer 419 is separated from the substrate 401 is described; however, the element formation layer 419 may be separated from the substrate 401 after the conductive films 434a and 434b are formed.

Figure 16A:
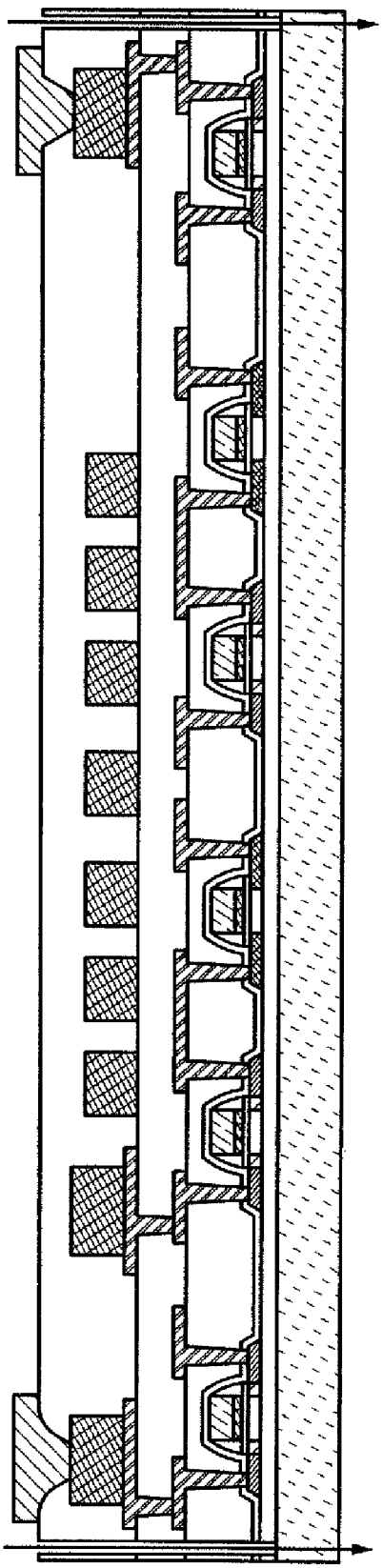
FIGS. 16A and 16B are explanatory views of a manufacturing method of a semiconductor device to which the present invention is applied.

Next, in the case where a plurality of elements are formed over the substrate, the element formation layer 419 is separated into separate elements (FIG. 16A). A laser irradiation apparatus, a dicing apparatus, a scribing apparatus, or the like can be used for the separation. Here, the plurality of elements formed over one substrate are separated from one another by laser beam irradiation.

Figure 16B:
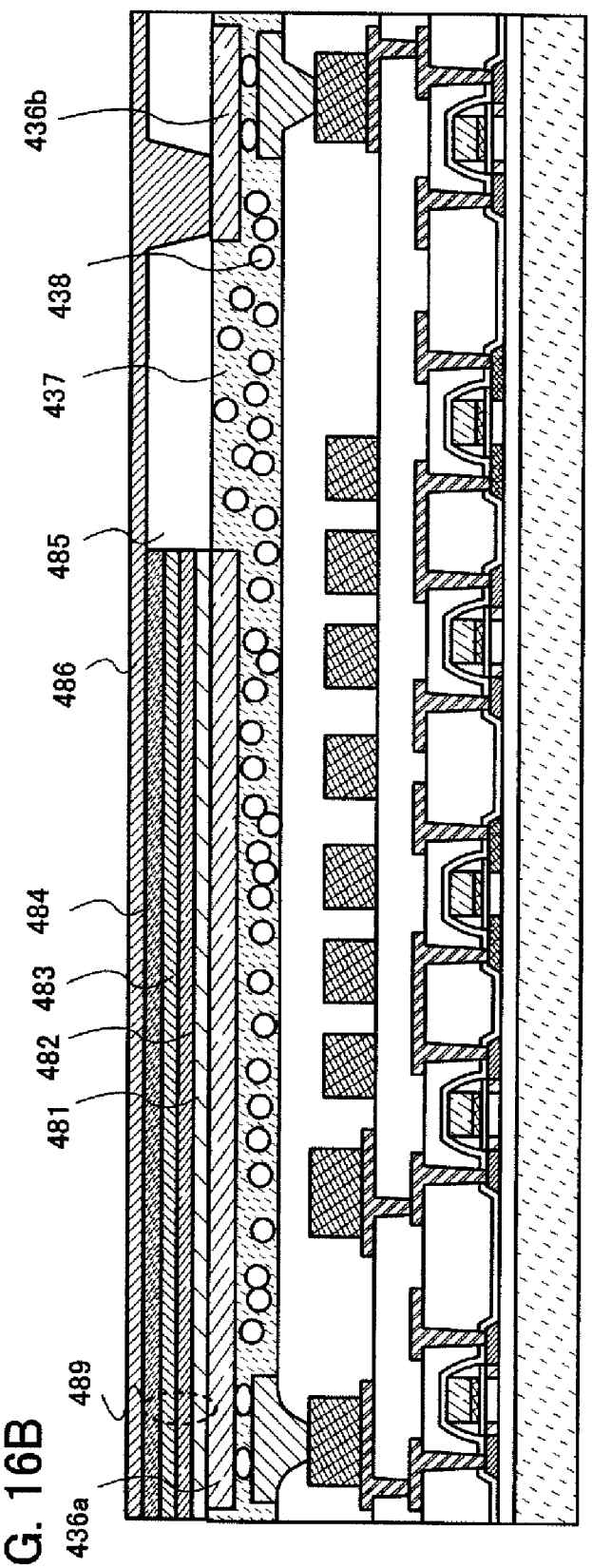

Next, the separated elements are electrically connected to the secondary battery (FIG. 16B). In this embodiment mode, a thin film secondary battery is used for the storage capacitor of the power source circuit, and the following thin films are sequentially stacked: a current-collecting thin film, a negative electrode active material layer, a solid electrolyte layer, a positive electrode active material layer, and a current-collecting thin film.

A conductive film 436a and a conductive film 436b are each formed of a conductive material by a CVD method; a sputtering method; a printing method such as screen-printing or gravure printing; a droplet discharging method, a dispensing method, or a plating method. The conductive material is formed into a single-layer structure or a stacked-layer structure using an element such as aluminum, titanium, silver, copper, gold, platinum, nickel, palladium, tantalum, or molybdenum, or an alloy material or compound material containing the element as its main component. The conductive material is desired to have good adhesion to a negative electrode active material and have low resistance. Aluminum, copper, nickel, vanadium, or the like is particularly preferable as the conductive material.

When the structure of the thin film secondary battery is described in detail, a negative electrode active material layer 481 is formed over the conductive film 436a. In general, vanadium oxide ($V_2O_5$) or the like is used. Next, a solid electrolyte layer 482 is formed over the negative electrode active material layer 481. In general, lithium phosphate ($Li_3PO_4$) or the like is used. Then, a positive electrode active material layer 483 is formed over the solid electrolyte layer 482. In general, lithium manganate ($LiMn_2O_4$) or the like is used. Alternatively, lithium cobaltate ($LiCoO_2$) or lithium nickelate ($LiNiO_2$) may be used. Next, a current-collecting thin film 484 that becomes an electrode is formed over the positive electrode active material layer 483. The current-collecting thin film 484 is desired to have good adhesion to the positive electrode active material layer 483 and have low resistance. Aluminum, copper, nickel, vanadium, or the like can be used as the current-collecting thin film 484.

Each of the foregoing thin film layers, that is, the negative electrode active material layer 481, the solid electrolyte layer 482, the positive electrode active material layer 483, and the current-collecting thin film 484, may be formed using a sputtering technique or an evaporation technique. The thickness of each layer is desirably 0.1 μm to 3 μm.

Next, a resin film is formed by a spin coating method or the like to form an interlayer film 485. Then, the interlayer film is etched to form a contact hole. The interlayer film is not limited to a resin, and the interlayer film may be another film such as an oxide film formed by a CVD method; however, a resin film is desirable in terms of flatness. Alternatively, the contact hole can be formed without etching by using a photosensitive resin. Then, by forming a wiring layer 486 over the interlayer film and connecting the wiring layer 486 to the conductive film 434b, electrical connection with the secondary battery is obtained.

Here, the conductive films 434a and 434b provided over the element formation layer 419 are connected to the conductive films 436a and 436b that serve as connecting terminals of a thin film secondary battery 489, respectively. The case is shown in which the conductive film 434a and the conductive film 436a, or the conductive film 434b and the conductive film 436b, are pressure-bonded to each other with a material having an adhesive property such as an anisotropic conductive film (ACF) or an anisotropic conductive paste (ACP) interposed therebetween, so that they are electrically connected to each other. An example is shown in which conductive particles 438 contained in a resin 437 having an adhesive property are used for connection. Alternatively, connection can also be obtained using a conductive adhesive agent such as a silver paste, a copper paste, or a carbon paste, or using solder bonding, or the like.

Note that a structure of a transistor can be of various modes, and is not limited to the specific structure described in this embodiment mode. For example, a multi-gate structure in which there are two or more gate electrodes may be used. In a multi-gate structure, channel regions are connected in series; accordingly, the structure is that in which a plurality of transistors are connected in series. By having a multi-gate structure, off-current is reduced, and withstand voltage of the transistors is enhanced and reliability is improved, and even if voltage between the drain and source electrodes changes when operating in a saturation region, current between the drain and source electrodes does not change very much and a flat characteristic or the like can be obtained. In addition, the structure may be that in which gate electrodes are placed over and below a channel. With a structure in which gate electrodes are placed over and below the channel, the channel region increases; accordingly, a current value can be increased and a depletion layer is easily formed, thereby decreasing a sub-threshold swing. When the gate electrodes are placed over and below the channel, the structure is like that in which a plurality of transistors are connected in parallel.

Alternatively, the transistor used in the present invention may have a structure in which a gate electrode is placed over the channel formation region, a structure in which a gate electrode is placed below the channel formation region, a staggered structure, or an inverted staggered structure. Further alternatively, the structure may be that in which a channel formation region is divided into a plurality of regions, and the plurality of channel formation regions may be connected in parallel or in series. Further, a source electrode or a drain electrode may overlap with the channel formation region (or a part thereof). By having a structure in which the source electrode or drain electrode overlaps with the channel formation region (or a part thereof), unstable operation due to accumulation of electric charge in a part of the channel formation region can be prevented. Further, there may also be an LDD (Lightly Doped Drain) region. By providing an LDD region, off-current is reduced, and withstand voltage of the transistors is enhanced and reliability is improved, and even if voltage between the drain and source electrodes changes when operating in a saturation region, current between the drain and source electrodes does not change very much and a flat characteristic or the like can be obtained.

The method for manufacturing the semiconductor device in this embodiment mode can be applied to the ADC and the semiconductor device having the ADC described in this specification. That is, according to this embodiment mode, a semiconductor device, in which various parameters which determine operation can be more freely set, can be formed. Consequently, resolving power can be improved in the case of keeping a dynamic range. Alternatively, by lengthening a clock cycle for counting a discharging period, power consumption can be reduced. Further, it is not necessary to consider the offset voltage, so that the output period $T_2$ is not varied and digital data that is obtained can be more precise.

Embodiment Mode 6

This embodiment mode will describe an example of a method for manufacturing the semiconductor device described in the preceding embodiment modes, with reference to the drawings. In this embodiment mode, a structure in which an antenna, a battery, and a signal processing circuit of the semiconductor device are formed over the same substrate will be explained. Note that an antenna, a battery, and a signal processing circuit are formed together over a single crystal substrate using transistors including channel formation regions. When transistors are formed using a single crystal substrate, a semiconductor device having transistors with few variations in electric characteristics can be formed, which is preferable. In addition, in this embodiment mode, an example is explained in which a thin-film secondary battery is used as a battery.

Figure 17A:
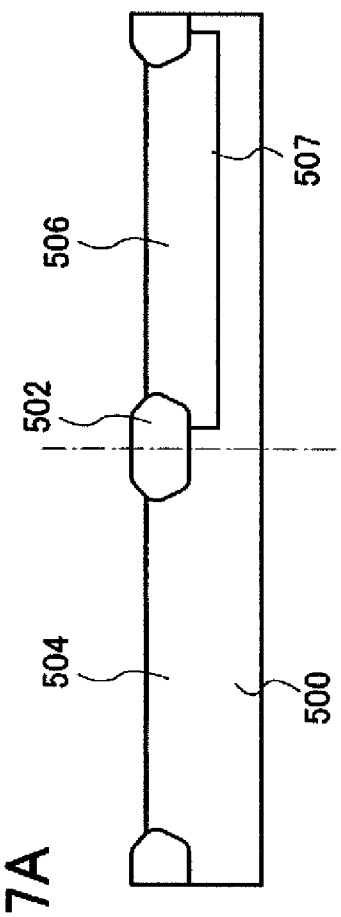
FIGS. 17A to 17C are explanatory views of a manufacturing method of a semiconductor device to which the present invention is applied.

First, regions 504 and 506 are formed in a semiconductor substrate 500 by separating an element region (FIG. 17A). The regions 504 and 506 provided in the semiconductor substrate 500 are insulated from each other by an insulating film (also referred to as a field oxide film) 502. The example shown here is the case where a single crystal Si substrate having n-type conductivity is used as the semiconductor substrate 500, and a p-well 507 is formed in the region 506 of the semiconductor substrate 500.

Any substrate can be used as the semiconductor substrate 500 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The regions 504 and 506 can be formed by a LOCOS (local oxidation of silicon) method, a trench isolation method, or the like.

In addition, the p-well 507 formed in the region 506 of the semiconductor substrate 500 can be formed by selective doping of the semiconductor substrate 500 with an impurity element imparting p-type conductivity. As an impurity element imparting p-type conductivity, boron, aluminum, gallium, or the like can be used.

In this embodiment mode, although the region 504 is not doped with an impurity element because an n-type semiconductor substrate is used as the semiconductor substrate 500, an n-well may be formed in the region 504 by introduction of an impurity element imparting n-type conductivity. As an impurity element imparting n-type conductivity, phosphorus, arsenic, or the like can be used. When a p-type semiconductor substrate is used, on the other hand, the region 504 may be doped with an n-type impurity element to form an n-well, whereas the region 506 may not be doped with an impurity element.

Figure 17B:
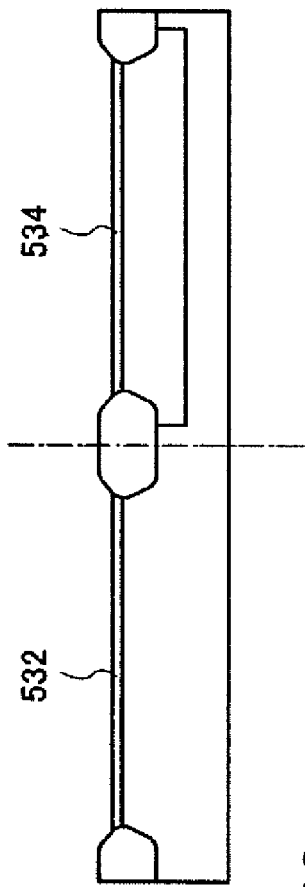

Next, insulating films 532 and 534 are formed so as to cover the regions 504 and 506, respectively (FIG. 17B).

For example, the surfaces of the regions 504 and 506 provided in the semiconductor substrate 500 are oxidized by heat treatment, so that the insulating films 532 and 534 can be formed of silicon oxide films. Alternatively, the insulating films 532 and 534 may be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 532 and 534 may be formed by plasma treatment as described above. For example, the insulating films 532 and 534 can be formed using a silicon oxide film or a silicon nitride film which is obtained by application of high-density plasma oxidation or high-density plasma nitridation treatment to the surfaces of the regions 504 and 506 provided in the semiconductor substrate 500. Furthermore, after applying high-density plasma oxidation treatment to the surfaces of the regions 504 and 506, high-density plasma nitridation treatment may be performed. In that case, silicon oxide films are formed on the surfaces of the regions 504 and 506, and then silicon oxynitride films are formed on the silicon oxide films. Thus, the insulating films 532 and 534 are each formed to have a stacked structure of the silicon oxide film and the silicon oxynitride film. In addition, after silicon oxide films are formed on the surfaces of the regions 504 and 506 by a thermal oxidation method, high-density plasma oxidation or high-density plasma nitridation treatment may be applied to the silicon oxide films.

The insulating films 532 and 534 formed over the regions 504 and 506 of the semiconductor substrate 500 respectively function as gate insulating films of transistors which are completed later.

Figure 17C:
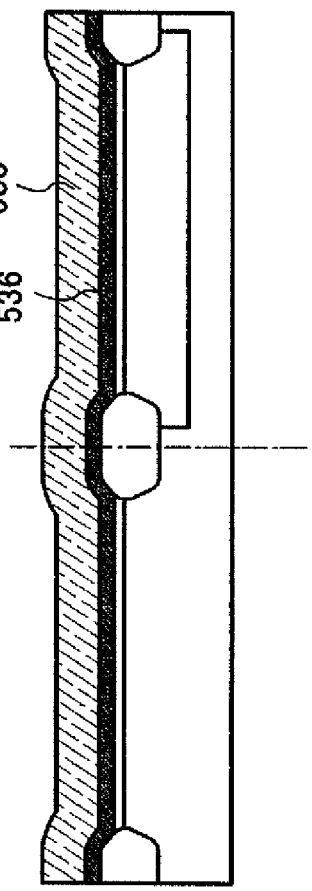

Next, a conductive film is formed so as to cover the insulating films 532 and 534 which are formed over the regions 504 and 506, respectively (FIG. 17C). Here, an example is shown in which conductive films 536 and 538 are sequentially stacked as the conductive film. It is need less to say that the conductive film may be formed to have a single layer or a stacked structure of three or more layers.

As materials of the conductive films 536 and 538, an element such as tantalum, tungsten, titanium, molybdenum, aluminum, copper, chromium, or niobium, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this embodiment mode, the conductive film 536 is formed using a tantalum nitride film and the conductive film 538 is formed thereover using a tungsten film. Alternatively, it is also possible to form the conductive film 536 using a single-layer film or a stacked film of a tungsten nitride film, a molybdenum nitride film, and/or a titanium nitride film and form the conductive film 538 using a single-layer film or a stacked film of a tantalum film, a molybdenum film, and/or a titanium film.

Next, the stacked conductive films 536 and 538 are selectively removed by etching, so that the conductive films 536 and 538 remain above desired parts of the regions 504 and 506, respectively. Thus, gate electrodes 540 and 542 are formed (FIG. 18A).

Next, a resist mask 548 is selectively formed so as to cover the region 504, and desired parts of the region 506 are doped with an impurity element, using the resist mask 548 and the gate electrode 542 as masks, so that impurity regions are formed (FIG. 18B). As an impurity element, an impurity element imparting n-type conductivity or an impurity element imparting p-type conductivity is used. As an impurity element imparting n-type conductivity, phosphorus, arsenic, or the like can be used. As an impurity element imparting p-type conductivity, boron, aluminum, gallium, or the like can be used. Here, phosphorus is used as the impurity element.

In FIG. 18B, by introduction of the impurity element, impurity regions 552 which form source and drain regions and a channel formation region 550 are formed in the region 506.

Next, a resist mask 566 is selectively formed so as to cover the region 506, and the region 504 is doped with an impurity element, using the resist mask 566 and the gate electrode 540 as masks, so that impurity regions are formed (FIG. 18C). As the impurity element, an impurity element imparting n-type conductivity or an impurity element imparting p-type conductivity is used. As an n-type impurity element, phosphorus, arsenic, or the like can be used. As a p-type impurity element, boron, aluminum, gallium, or the like can be used. At this time, an impurity element (e.g., boron) of a conductivity type different from that of the impurity element introduced into the region 506 in FIG. 18B is used. As a result, impurity regions 570 which form source and drain regions and a channel formation region 568 are formed in the region 504.

Figure 19A:
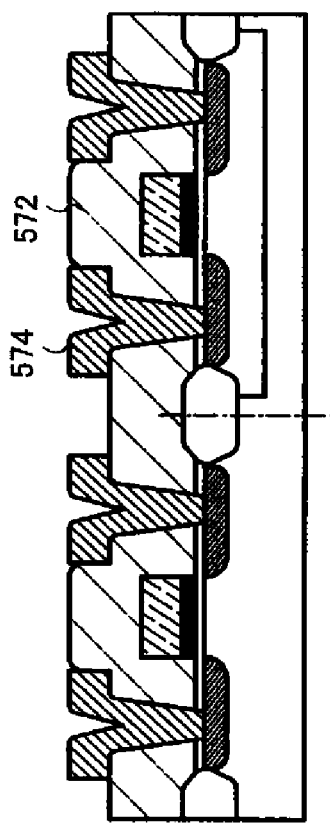
FIGS. 19A and 19B are explanatory views of a manufacturing method of a semiconductor device to which the present invention is applied.

Next, an insulating film 572 is formed so as to cover the insulating films 532 and 534 and the gate electrodes 540 and 542. Then, wirings 574, which are electrically connected to the impurity regions 552 and 570 formed in the regions 506 and 504 respectively, are formed over the insulating film 572 (FIG. 19A).

The insulating film 572 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (diamond-like carbon); an organic material such as epoxy, polyimide, polyamide, polyvinyl phenol, benzocyclobutene, or acrylic; or a siloxane material such as a siloxane resin by a CVD method, a sputtering method, or the like. A siloxane material corresponds to a material having a bond of Si—O—Si. Siloxane has a skeleton structure with the bond of silicon and oxygen. As a substituent of siloxane, an organic group containing at least hydrogen (e.g., an alkyl group or aromatic hydrocarbon) is given. Also, a fluoro group may be given as the substituent, or both a fluoro group and an organic group containing at least hydrogen may be given.

The wirings 574 are formed with a single layer or a stacked layer of an element such as aluminum, tungsten, titanium, tantalum, molybdenum, nickel, platinum, copper, gold, silver, manganese, neodymium, carbon, or silicon, or an alloy material or a compound material containing such an element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. The wirings 574 are preferably formed to have a stacked structure of a barrier film, an aluminum-silicon film, and a barrier film or a stacked structure of a barrier film, an aluminum silicon film, a titanium nitride film, and a barrier film. Note that the "barrier film" corresponds to a thin film formed of titanium, a nitride of titanium, molybdenum, or a nitride of molybdenum. Aluminum and aluminum silicon are suitable materials for forming the wirings 574 because they have low resistance and are inexpensive. When barrier films are provided as the top layer and the bottom layer, generation of hillocks of aluminum and aluminum silicon can be prevented. When a barrier film is formed of titanium which is an element having a high reducing property, even when there is a thin natural oxide film formed on the crystalline semiconductor film, the natural oxide film can be reduced, and a favorable contact with the crystalline semiconductor film can be obtained.

Note that the structure of transistors used in the present invention is not limited to the one shown in the drawing. For example, a transistor with an inverted staggered structure, a FinFET structure, or the like can be used. A FinFET structure is preferable because it can suppress a short channel effect which occurs along with reduction in transistor size.

The semiconductor device of the present invention includes a battery which can store electric power and supply electric power to the signal processing circuit. As the battery, a capacitor such as an electric double layer capacitor or a thin-film secondary battery is preferably used. In this embodiment mode, a connection between the transistor and a thin-film secondary battery is explained.

Figure 19B:
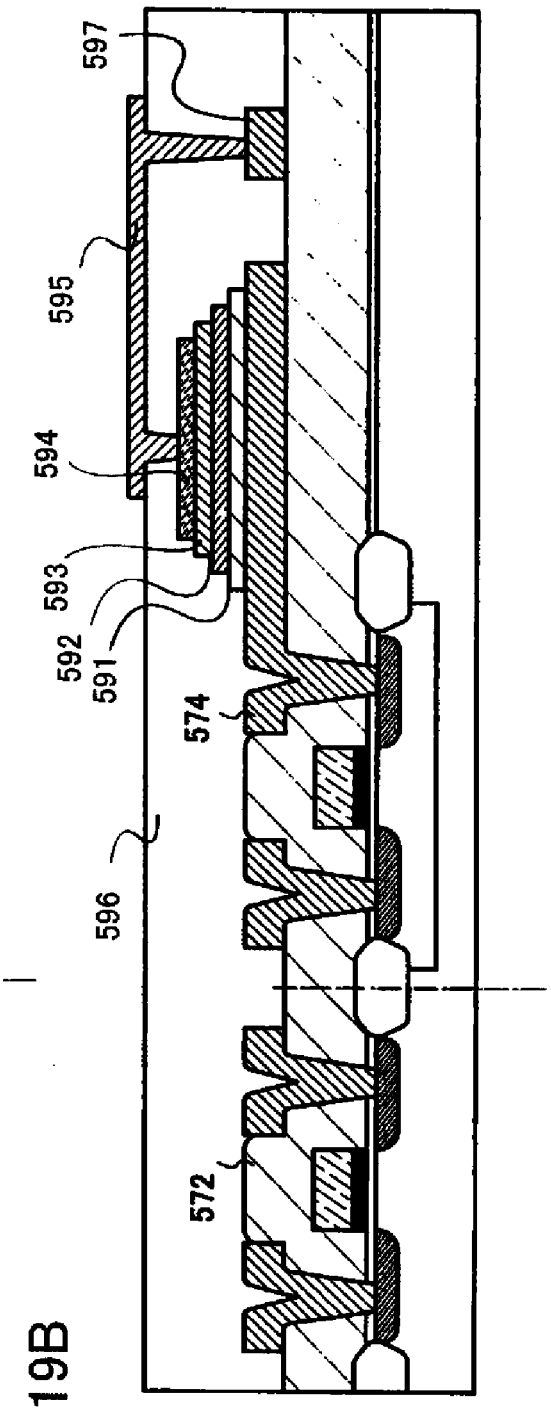

In this embodiment mode, the secondary battery is stacked over the wiring 574 connected to the transistor. The secondary battery has a structure in which a current-collecting thin film, a negative electrode active material layer, a solid electrolyte layer, a positive electrode active material layer, and a current-collecting thin film are sequentially stacked (FIG. 19B). Therefore, the material of the wiring 574 which also has a function of the current-collecting thin film of the secondary battery should have high adhesion to the negative electrode active material and also low resistance. In particular, aluminum, copper, nickel, vanadium, and the like are preferably used.

Next, the structure of the thin-film secondary battery is described. A negative electrode active material layer 591 is formed over the wiring 574. In general, vanadium oxide ($V_2O_5$) or the like is used. Next, a solid electrolyte layer 592 is formed over the negative electrode active material layer 591. In general, lithium phosphate ($Li_3PO_4$) or the like is used. Next, a positive electrode active material layer 593 is formed over the solid electrolyte layer 592. In general, lithium manganate ($LiMn_2O_4$) or the like is used. Lithium cobaltate ($LiCoO_2$) or lithium nickel oxide ($LiNiO_2$) may also be used. Next, a current-collecting thin film 594 to serve as an electrode is formed over the positive electrode active material layer 593. The current-collecting thin film 594 should have high adhesion to the positive electrode active material layer 593 and also low resistance. For example, aluminum, copper, nickel, vanadium, or the like can be used.

Each of the above-described thin layers of the negative electrode active material layer 591, the solid electrolyte layer 592, the positive electrode active material layer 593, and the current-collecting thin film 594 may be formed by a sputtering technique or an evaporation technique. In addition, the thickness of each layer is preferably 0.1 μm to 3 μm.

Next, a resin film is formed by a spin coating method or the like. Then, the resin film is etched to form a contact hole, so that an interlayer film 596 is formed. The interlayer film 596 is not limited to a resin film, and other films such as an oxide film formed by a CVD method may also be used; however, a resin is preferably used in terms of flatness. In addition, the contact hole can be formed without etching when a photosensitive resin is used. Next, a wiring layer 595 is formed over the interlayer film 596 and connected to a wiring 597. Thus, electrical connection with the secondary battery is obtained.

With the above-described structure, the semiconductor device of the present invention can have a structure in which transistors are formed on a single crystal substrate and a thin-film secondary battery is formed thereover. Thus, in this embodiment mode, a semiconductor device which is very thin and small can be formed.

The method for manufacturing the semiconductor device in this embodiment mode can be applied to any of the semiconductor devices in this specification. That is, according to this embodiment mode, a semiconductor device, in which various parameters which determine operation can be more freely set, can be formed. Consequently, resolving power can be improved in the case of keeping a dynamic range. Alternatively, by lengthening a clock cycle for counting a discharging period, power consumption can be reduced. Further, it is not necessary to consider the offset voltage, so that the output period $T_2$ is not varied and digital data that is obtained can be more precise.

Embodiment Mode 7

This embodiment mode will describe an example of a method for manufacturing a semiconductor device, which is different from that described in the preceding embodiment mode, with reference to the drawings.

Figure 20A:
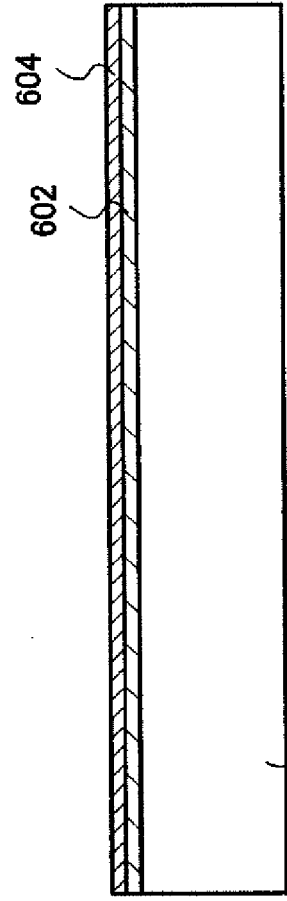
FIGS. 20A to 20C are explanatory views of a manufacturing method of a semiconductor device to which the present invention is applied.

First, an insulating film is formed over a substrate 600. Here, a single crystal silicon substrate having n-type conductivity is used as the substrate 600, and insulating films 602 and 604 are formed over the substrate 600 (FIG. 20A). For example, a silicon oxide film is formed as the insulating film 602 by application of heat treatment to the substrate 600, and then a silicon nitride film is formed over the insulating film 602 by a CVD method.

The substrate 600 is not limited to a silicon substrate as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

Alternatively, after forming the insulating film 602, the insulating film 604 may be formed by nitridation of the insulating film 602 by high-density plasma treatment. Note that the insulating film provided over the substrate 600 may have a single-layer structure or a stacked structure of three or more layers.

Figure 20B:
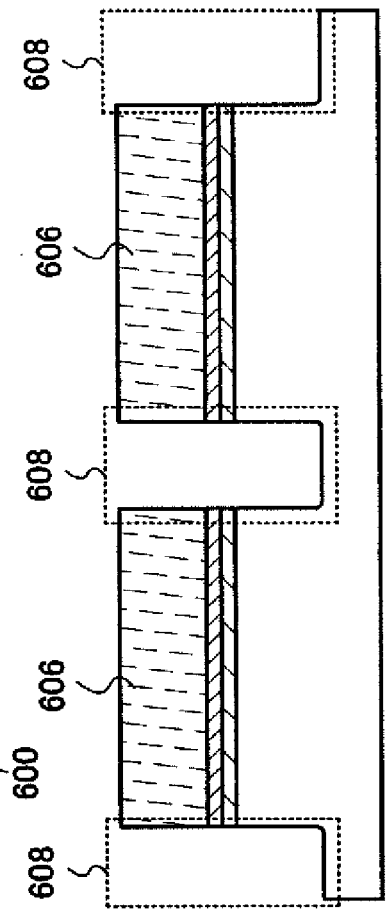

Next, patterns of a resist mask 606 are selectively formed over the insulating film 604, and selective etching is performed using the resist mask 606 as a mask, so that recessed portions 608 are selectively formed in the substrate 600 (FIG. 20B). For the etching of the substrate 600 and the insulating films 602 and 604, plasma dry etching can be conducted.

Figure 20C:
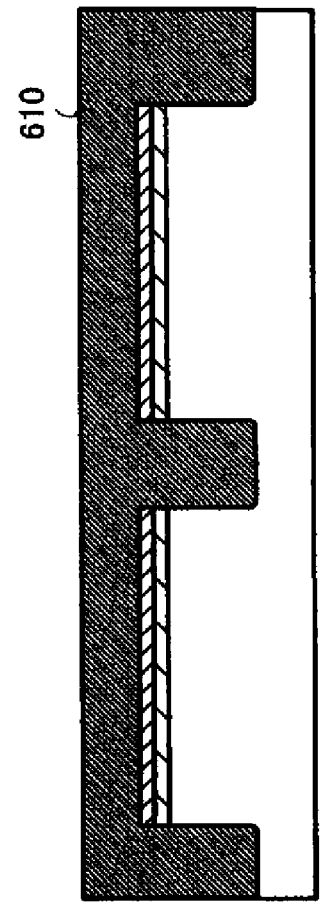

Next, the patterns of the resist mask 606 are removed, and then an insulating film 610 is formed so as to fill the recessed portions 608 formed in the substrate 600 (FIG. 20C).

The insulating film 610 is formed of an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. As the insulating film 610, a silicon oxide film is formed by an atmospheric pressure CVD method or a low-pressure CVD method using a TEOS (tetraethyl orthosilicate) gas.

Next, the surface of the substrate 600 is exposed by grinding treatment or polishing treatment such as CMP (chemical mechanical polishing). Here, by exposure of the surface of the substrate 600, regions 612 and 613 are formed between insulating films 611 which are formed in the recessed portions 608 of the substrate 600. The insulating film 610 formed over the surface of the substrate 600 is removed by grinding treatment or polishing treatment such as CMP, so that the insulating films 611 are obtained. Then, by selective introduction of an impurity element imparting p-type conductivity, a p-well 615 is formed in the region 613 of the substrate 600 (FIG. 21A).

As an impurity element imparting p-type conductivity, boron, aluminum, gallium, or the like can be used. In this case, boron is introduced into the region 613 as the impurity element.

Further, in this embodiment mode, although the region 612 is not doped with an impurity element because an n-type semiconductor substrate is used as the substrate 600, an n-well may be formed in the region 612 by introduction of an n-type impurity element. As an n-type impurity element, phosphorus, arsenic, or the like can be used.

When a p-type semiconductor substrate is used, on the other hand, the region 612 may be doped with an impurity element imparting n-type conductivity to form an n-well, whereas the region 613 may not be doped with an impurity element.

Next, insulating films 632 and 634 are formed over the surfaces of the regions 612 and 613 in the substrate 600, respectively (FIG. 21B).

For example, the surfaces of the regions 612 and 613 provided in the substrate 600 are oxidized by heat treatment, so that the insulating films 632 and 634 of silicon oxide films can be formed. Alternatively, the insulating films 632 and 634 may each be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 632 and 634 may be formed by plasma treatment as described above. For example, the insulating films 632 and 634 can be formed with a silicon oxide film or a silicon nitride film which is obtained by application of high-density plasma oxidation or high-density plasma nitridation treatment to the surfaces of the regions 612 and 613 provided in the substrate 600. In addition, after application of high-density plasma oxidation treatment to the surfaces of the regions 612 and 613, high-density plasma nitridation treatment may be conducted. In that case, silicon oxide films are formed on the surfaces of the regions 612 and 613 and then silicon oxynitride films are formed on the silicon oxide films. Thus, the insulating films 632 and 634 are each formed to have a stacked structure of the silicon oxide film and the silicon oxynitride film. In addition, silicon oxide films are formed on the surfaces of the regions 612 and 613 by a thermal oxidation method, and then high-density plasma oxidation treatment or high-density plasma nitridation treatment may be performed to the silicon oxide films.

Note that the insulating films 632 and 634 formed over the regions 612 and 613 in the substrate 600 respectively function as gate insulating films of transistors which are completed later.

Next, a conductive film is formed so as to cover the insulating films 632 and 634 which are formed over the regions 612 and 613 provided in the substrate 600, respectively (FIG. 21C). In this embodiment mode, an example is shown in which conductive films 636 and 638 are sequentially stacked as the conductive film. It is needless to say that the conductive film may be formed to have a single layer or a stacked structure of three or more layers.

As materials of the conductive films 636 and 638, an element such as tantalum, tungsten, titanium, molybdenum, aluminum, copper, chromium, or niobium, or an alloy material or a compound material containing such an element as its main component can be used. Alternatively, a metal nitride film obtained by nitridation of such an element can also be used. Furthermore, a semiconductor material typified by polycrystalline silicon doped with an impurity element such as phosphorus can also be used.

In this case, a stacked structure is employed in which the conductive film 636 is formed using a tantalum nitride film and the conductive film 638 is formed thereover using a tungsten film. Alternatively, it is also possible to form the conductive film 636 using a single-layer film or a stacked film of tantalum nitride, tungsten nitride, molybdenum nitride, and/or titanium nitride and form the conductive film 638 using a single-layer film or a stacked film of tungsten, tantalum, molybdenum, and/or titanium.

Figure 22A:
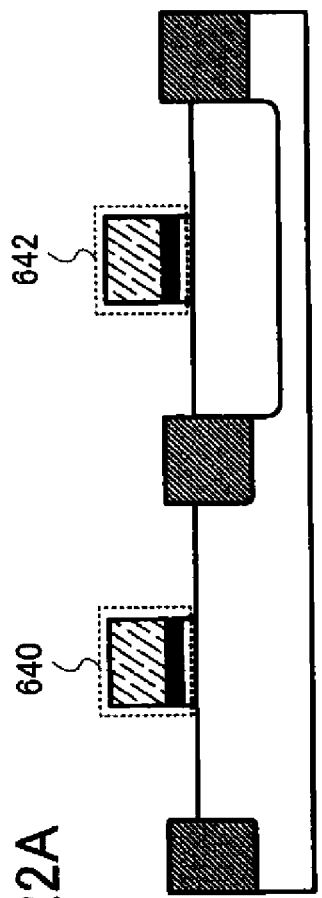
FIGS. 22A to 22C are explanatory views of a manufacturing method of a semiconductor device to which the present invention is applied.

Next, the stacked conductive films 636 and 638 are selectively removed by etching, so that the conductive films 636 and 638 remain above parts of the regions 612 and 613 of the substrate 600. Thus, conductive films 640 and 642 functioning as gate electrodes are formed (FIG. 22A). Here, the surfaces of the regions 612 and 613 of the substrate 600 which do not overlap with the conductive films 640 and 642 respectively are exposed.

Specifically, in the region 612 of the substrate 600, a part of the insulating film 632 formed below the conductive film 640, which does not overlap with the conductive film 640, is selectively removed, so that the ends of the conductive film 640 and the ends of the insulating film 632 are almost aligned with each other. In addition, in the region 613 of the substrate 600, a part of the insulating film 634 formed below the conductive film 642, which does not overlap with the conductive film 642, is selectively removed, so that the ends of the conductive film 642 and the ends of the insulating film 634 are almost aligned with each other.

In this case, the parts of the insulating films and the like which do not overlap with the conductive films 640 and 642 may be removed at the same time as the formation of the conductive films 640 and 642. Alternatively, the parts of the insulating films and the like which do not overlap with the conductive films 640 and 642 may be removed using resist masks which are left after the formation of the conductive films 640 and 642 or the conductive films 640 and 642 as masks.

Figure 22B:
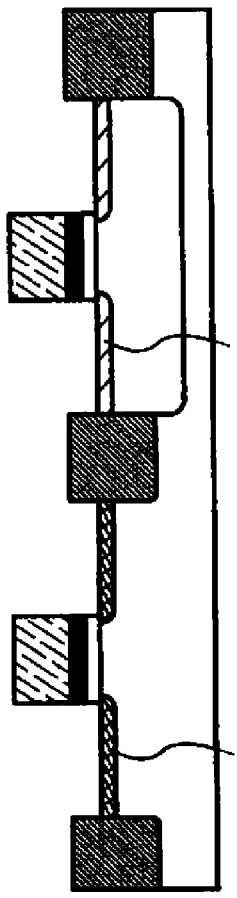

Then, the regions 612 and 613 of the substrate 600 are selectively doped with an impurity element (FIG. 22B). At this time, the region 613 is selectively doped with an impurity element imparting n-type conductivity using the conductive film 642 as a mask, whereas the region 612 is selectively doped with an impurity element imparting p-type conductivity using the conductive film 640 as a mask. As an impurity element imparting n-type conductivity, phosphorus, arsenic, or the like can be used. As an impurity element imparting p-type conductivity, boron, aluminum, gallium, or the like can be used.

Next, sidewalls 654 which are in contact with the side surfaces of the conductive films 640 and 642 are formed. Specifically, the sidewalls are formed with a single layer or a stacked layer of a film containing an inorganic material such as silicon, silicon oxide, or silicon nitride, and/or a film containing an organic material such as an organic resin by a plasma CVD method, a sputtering method, or the like. Then, such an insulating film is selectively etched by anisotropic etching mainly in the perpendicular direction, so that the sidewalls 654 can be formed so as to be in contact with the side surfaces of the conductive films 640 and 642. The sidewalls 654 are used as masks in doping for forming LDD (lightly doped drain) regions. In addition, the sidewalls 654 are formed to be in contact with the side surfaces of the insulating films formed below the conductive films 640 and 642.

Figure 22C:
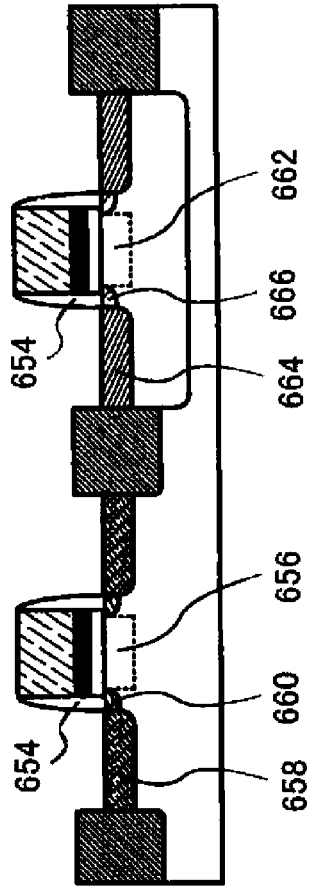

Next, the regions 612 and 613 of the substrate 600 are doped with an impurity element, using the sidewalls 654 and the conductive films 640 and 642 as masks, so that impurity regions which function as source and drain regions are formed (FIG. 22C). At this time, the region 613 of the substrate 600 is doped with an impurity element imparting n-type conductivity at higher concentration than in the LDD region, using the sidewalls 654 and the conductive film 642 as masks, whereas the region 612 is doped with an impurity element imparting p-type conductivity at higher concentration than in the LDD region, using the sidewalls 654 and the conductive film 640 as masks.

As a result, impurity regions 658 which form source and drain regions, low-concentration impurity regions 660 which form LDD regions, and a channel formation region 656 are formed in the region 612 of the substrate 600. Meanwhile, impurity regions 664 which form source and drain regions, low-concentration impurity regions 666 which form LDD regions, and a channel formation region 662 are formed in the region 613 of the substrate 600.

In this embodiment mode, the impurity elements are introduced under the condition that parts of the regions 612 and 613 of the substrate 600 which do not overlap with the conductive films 640 and 642 are exposed. Accordingly, the channel formation regions 656 and 662 which are formed in the regions 612 and 613 of the substrate 600 respectively can be formed in a self-aligned manner, using the conductive films 640 and 642.

Figure 23A:
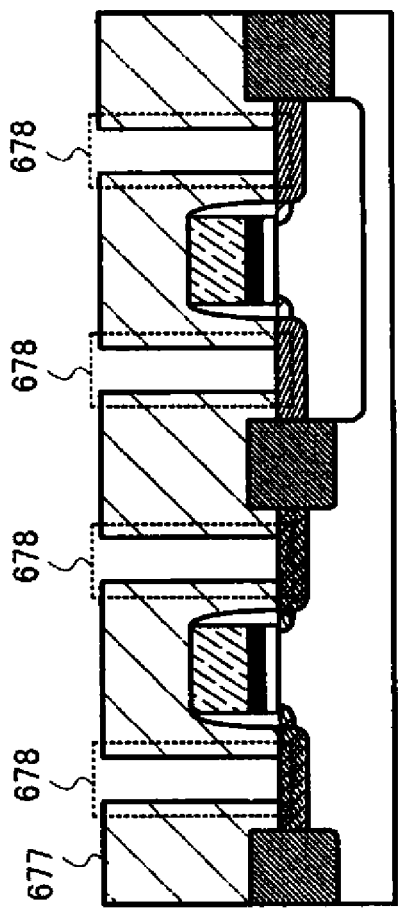
FIGS. 23A and 23B are explanatory views of a manufacturing method of a semiconductor device to which the present invention is applied.

Next, an insulating film is formed so as to cover the insulating films, the conductive films, and the like which are provided over the regions 612 and 613 of the substrate 600, and opening portions 678 are formed in the insulating film, so that an insulating film 677 is formed (FIG. 23A).

The insulating film 677 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (diamond-like carbon); an organic material such as epoxy, polyimide, polyamide, polyvinyl phenol, benzocyclobutene, or acrylic; or a siloxane material such as a siloxane resin, by a CVD method, a sputtering method, or the like. A siloxane material corresponds to a material having a bond of Si—O—Si. Siloxane has a skeleton structure with the bond of silicon and oxygen. As a substituent of siloxane, an organic group containing at least hydrogen (e.g., an alkyl group or aromatic hydrocarbon) is used. In addition, a fluoro group may be used as the substituent. Further, a fluoro group and an organic group containing at least hydrogen may be used as the substituent.

Figure 23B:
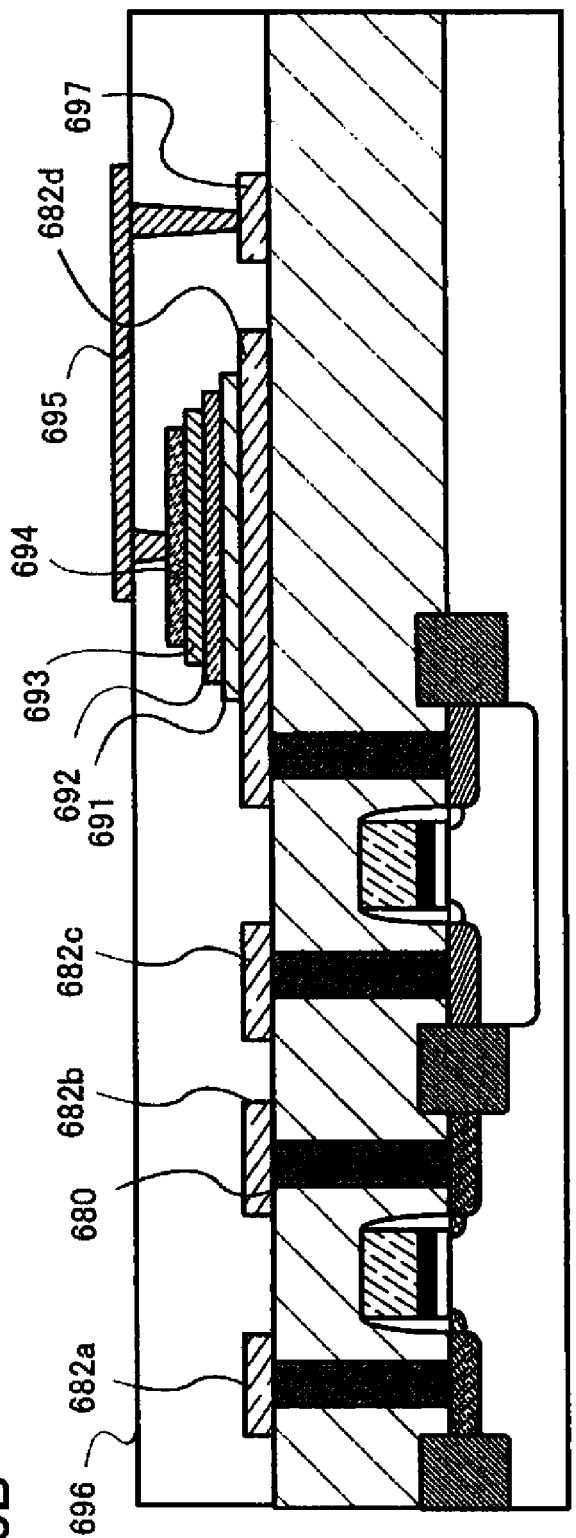

Next, conductive films 680 are formed in the opening portions 678 by a CVD method or the like. Then, conductive films 682a to 682d are selectively formed over the insulating film 677 so as to be electrically connected to the conductive films 680 (FIG. 23B).

The conductive films 680 and 682a to 682d are formed with a single layer or a stacked layer of an element such as aluminum, tungsten, titanium, tantalum, molybdenum, nickel, platinum, copper, gold, silver, manganese, neodymium, carbon, or silicon, or an alloy material or a compound material containing such an element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. For example, each of the conductive films 680 and 682a to 682d is preferably formed to have a stacked structure of a barrier film, an aluminum-silicon film, and a barrier film or a stacked structure of a barrier film, an aluminum-silicon film, a titanium nitride film, and a barrier film. Note that the "barrier film" corresponds to a thin film formed of titanium, titanium nitride, molybdenum, or molybdenum nitride. Aluminum and aluminum-silicon are suitable materials for forming the conductive films 680 and 682a to 682d because they have low resistance and are inexpensive. When barrier films are provided as the top layer and the bottom layer, generation of hillocks of aluminum and aluminum silicon can be prevented. When a barrier film formed of titanium which is an element having a high reducing property is formed, even when there is a thin natural oxide film formed on the crystalline semiconductor film, the natural oxide film can be reduced, and a favorable contact with the crystalline semiconductor film can be obtained. Here, the conductive films 680 and 682a to 682d can be formed by selective growth of tungsten by a CVD method.

Through the above steps, a p-channel transistor formed in the region 612 of the substrate 600 and an n-channel transistor formed in the region 613 of the substrate 600 can be obtained.

Note that the structure of transistors constituting the semiconductor device of the present invention is not limited to the one shown in the drawings. For example, a transistor with an inverted staggered structure, a FinFET structure, or the like can be used. A FinFET structure is preferable because it can suppress a short channel effect which occurs along with reduction in transistor size.

The semiconductor device of the present invention includes a battery which can store electric power in the signal processing circuit. As the battery, an electric double layer capacitor or a thin-film secondary battery is preferably used. In this embodiment mode, a connection between the transistor and the thin-film secondary battery is explained.

In this embodiment mode, a secondary battery is stacked over the conductive film 682d connected to the transistor. The secondary battery has a structure in which a current-collecting thin film, a negative electrode active material layer, a solid electrolyte layer, a positive electrode active material layer, and a current-collecting thin film are sequentially stacked (FIG. 23B). Therefore, the material of the conductive film 682d which is also used as the current-collecting thin film of the secondary battery preferably has high adhesion to the negative electrode active material and also low resistance. In particular, aluminum, copper, nickel, vanadium, or the like is preferably used.

Then, the structure of the thin-film secondary battery is described in detail. A negative electrode active material layer 691 is formed over the conductive film 682d. In general, vanadium oxide ($V_2O_5$) or the like is used. Next, a solid electrolyte layer 692 is formed over the negative electrode active material layer 691. In general, lithium phosphate ($Li_3PO_4$) or the like is used. Next, a positive electrode active material layer 693 is formed over the solid electrolyte layer 692. In general, lithium manganate ($LiMn_2O_4$) or the like is used. Lithium cobaltate ($LiCoO_2$) or lithium nickel oxide ($LiNiO_2$) can also be used. Next, a current-collecting thin film 694 to serve as an electrode is formed over the positive electrode active material layer 693. The current-collecting thin film 694 should have high adhesion to the positive electrode active material layer 693 and also low resistance. For example, aluminum, copper, nickel, vanadium, or the like can be used.

Each of the above-described thin layers of the negative electrode active material layer 691, the solid electrolyte layer 692, the positive electrode active material layer 693, and the current-collecting thin film 694 may be formed by a sputtering technique or an evaporation technique. In addition, the thickness of each layer is preferably 0.1 μm to 3 μm.

Next, a resin film is formed by a spin coating method. Then, the resin film is etched to form a contact hole, so that an interlayer film 696 is formed. The interlayer film 696 is not limited to a resin, and other films such as an oxide film formed by a CVD method may also be used; however, a resin film is preferably used in terms of flatness. In addition, the contact hole can be formed without etching when a photosensitive resin is used. Next, a wiring layer 695 is formed over the interlayer film 696 and connected to a wiring 697. Thus, electrical connection with the secondary battery is obtained.

With the above-described structure, the semiconductor device of the present invention can have a structure in which the transistors are formed on the single crystal substrate and the thin-film secondary battery is formed thereover. Thus, according to the present invention, a very thin and small semiconductor device can be formed.

The method for manufacturing the semiconductor device in this embodiment mode can be applied to any of the semiconductor devices described in this specification. That is, according to this embodiment mode, a semiconductor device, in which various parameters which determine operation can be more freely set, can be formed. Consequently, resolving power can be improved in the case of keeping a dynamic range. Alternatively, by lengthening a clock cycle for counting a discharging period, power consumption can be reduced. Further, it is not necessary to consider the offset voltage, so that the output period $T_2$ is not varied and digital data that is obtained can be more precise.

Embodiment Mode 8

Figure 11E:
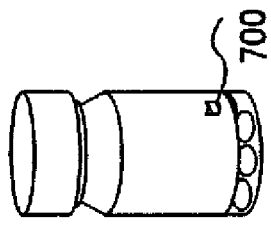
FIGS. 11A to 11F are examples of semiconductor devices employing the present invention, which are mounted on objects.
Figure 11F:
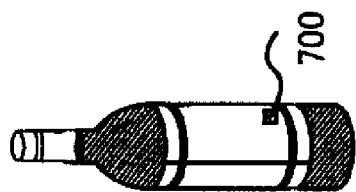
Figure 11C:
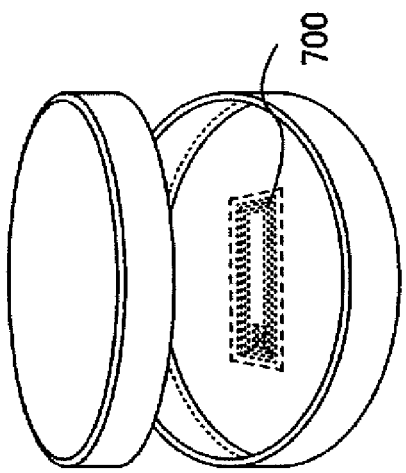
Figure 11D:
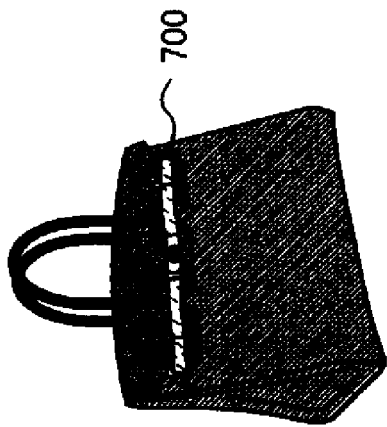
Figure 11A:
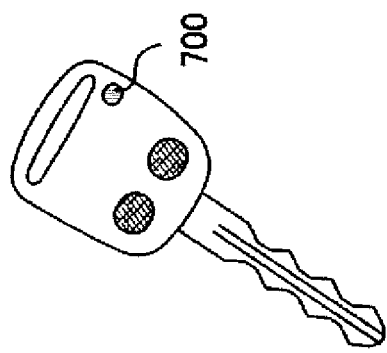
Figure 11B:
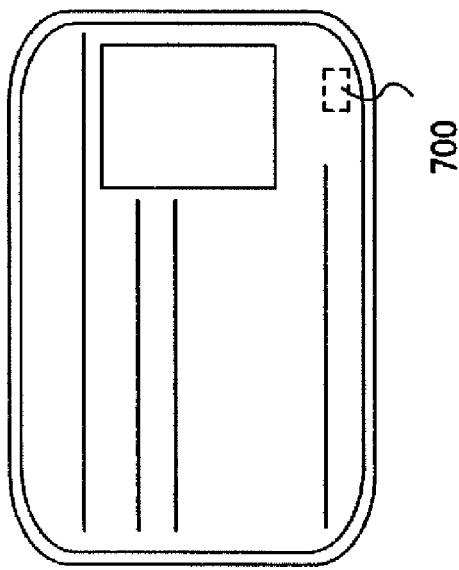

A semiconductor device 700 to which the present invention is applied can be used for a variety of items and systems by utilizing a function of transmitting and receiving an electromagnetic wave. As the items, the following items are given: keys (see FIG. 11A), paper money, coins, securities, bearer bonds, certificates (such as a driver's license or a resident's card, see FIG. 11B), books, containers (such as a Petri dish, see FIG. 11C), packaging containers (such as wrapping paper or bottles, see FIGS. 11E and 11F), recording media (such as a disk or video tape), vehicles (such as a bicycle), personal accessories (such as bags or eyeglasses, see FIG. 11D), food, clothing, livingware, electronic appliances (such as a liquid crystal display device, an EL display device, a television device, or a portable terminal), or the like. The semiconductor device of the present invention is fixed or mounted to items of a variety of forms such as those above by being attached to or embedded on the surface. Further, a system refers to a goods management system, an authentication function system, a distribution system, or the like. In addition, the semiconductor device 700 may be a sensor device.

In this manner, the semiconductor device to which the present invention is applied can be attached to a variety of items.

Embodiment 1

In this embodiment, dynamic ranges of the conventional integration type ADC illustrated in FIG. 2 and the integration type ADC of the present invention illustrated in FIG. 1 described in Embodiment Mode 1 are compared.

In this embodiment, it is supposed that the ADC is operated under the following required specification, that is, the ADC monitors the value of power source potential $V_{DD}$, which is a DC power source. Further, the ADC is operated with only $V_{DD}$ and ground potential $V_{GND}$.

Figure 24:
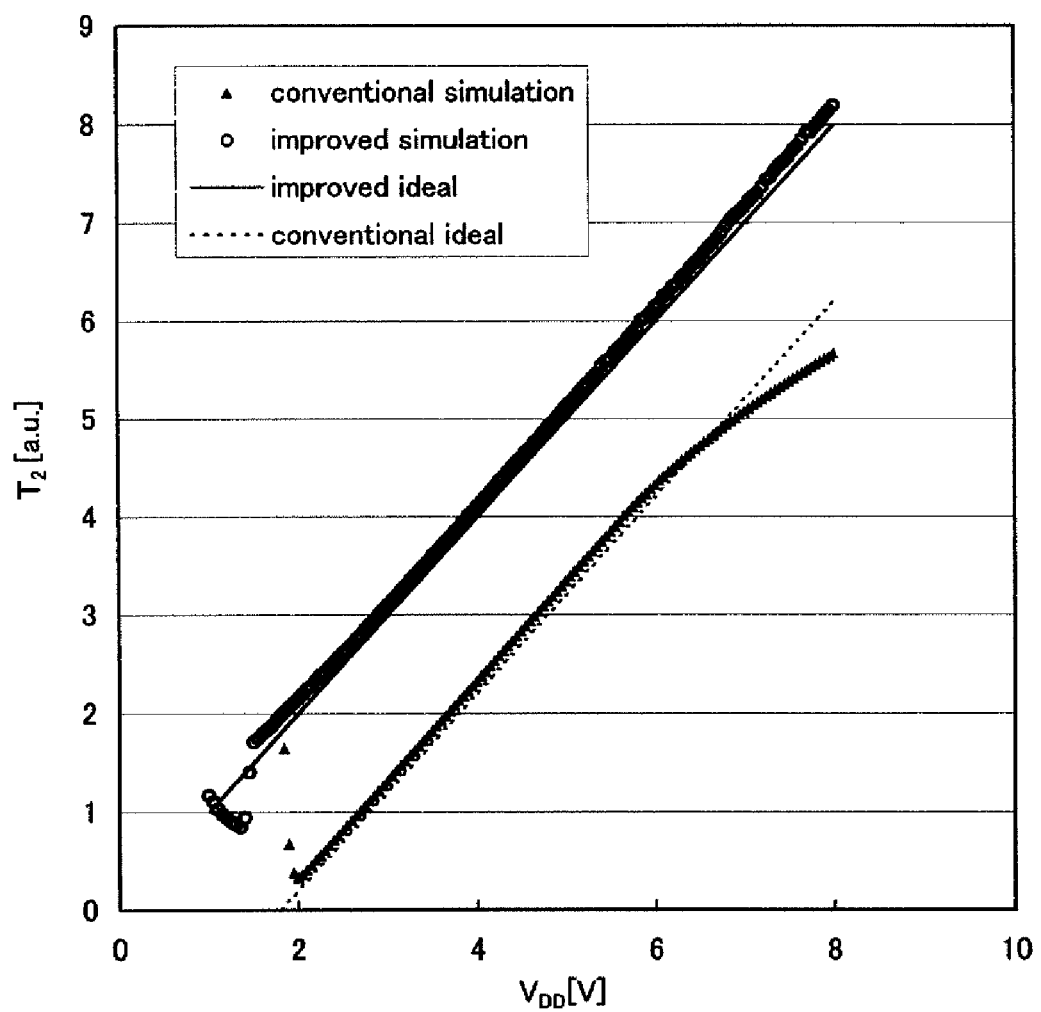
FIG. 24 is a graph used for explaining Embodiment 1.

FIG. 24 is a graph which compares input-output characteristics of the integration type ADC of the present invention (hereinafter referred to as a first ADC) with the conventional integration type ADC (hereinafter referred to as a second ADC). Among legends in the graph, "conventional ideal" represents a second ideal straight line, "improved ideal" represents a first ideal straight line, "conventional simulation" represents a second circuit calculation result ($V_{DD}$ input of 1.0 V to 8.0 V in increments of 0.1 V), and "improved simulation" represents a first circuit calculation result ($V_{DD}$ input of 1.0 V to 8.0 V in increments of 0.1 V). In the second ADC, offset potential $V_{offset}$=1.8 V (generated from $V_{DD}$ with the use of a regulator circuit, which monitors output voltage and controls the voltage to be constant) and reference potential $V_{ref}$=0 V are set, and various parameters are determined to operate the ADC normally only in the case of 2.0 V<$V_{DD}$<6.0V. On the other hand, although k=0.9 and $V_{const}$=0.67 regarding the multiplier circuit 112 and the subtraction circuit 113 which generate the offset voltage $V_{offset}$ and the reference potential $V_{ref}$ respectively in the first ADC, the same values as in the second ADC are used regarding other circuits. Note that there is generated some deviations between the circuit calculation result and the ideal straight lines. This is because the calculation result includes delay of peripheral circuits.

When dynamic ranges of the first ADC and the second ADC are compared, 2.0V<$V_{DD}$<6.0V in the second ADC as designed, but in the first ADC, it is found that the dynamic range of the first ADC has a wider range than the dynamic range of the second ADC with respect to both the lower limit and the upper limit. The dynamic range of the second ADC is limited to the range represented by the equation (3). On the other hand, in the first ADC at least in this example, there is no upper limit, and an element which determines the lower limit is the subtraction circuit 113 which generates the reference potential $V_{ref}$. This shows that the equation (3) is always satisfied.

As described above, with the use of the present invention, the dynamic range of the integration type ADC can be more enlarged than in the conventional ADC. Further, it has become clear that various parameters which determine operation of the integration type ADC can be more freely set, and the effect of the present invention has been proved.

This application is based on Japanese Patent Application serial no. 2006-351791 filed with Japan Patent Office on Dec. 27, 2006, the entire contents of which are hereby incorporated by reference.

What is claimed is:

1. An integration type analog to digital converter comprising:
   an integrator including an operation amplifier and a capacitor, the capacitor being electrically connected between an inverted input terminal and an output terminal of the operational amplifier;
   a first switch electrically connected to the capacitor in parallel;
   a second switch;
   a third switch wherein a terminal of the second switch and a terminal of the third switch are electrically connected to each other and to the inverted input terminal of the operational amplifier;
   a multiplier circuit; and
   a subtraction circuit,
   wherein an output terminal of the multiplier circuit and an input terminal of the subtraction circuit are electrically connected to each other and to a non-inverted input terminal of the operational amplifier;
   wherein an input terminal of the multiplier circuit is electrically connected to the other terminal of the second switch; and
   wherein an output terminal of the subtraction circuit is electrically connected to the other terminal of the third switch.

2. The integration type analog to digital converter according to claim 1,
   wherein the multiplier circuit includes a first resistor and a second resistor;
   wherein one terminal of the first resistor and one terminal of the second resistor are electrically connected to each other and the input terminal of the multiplier;
   wherein the other terminal of the first resistor is electrically connected to the input terminal of the subtraction circuit; and
   wherein the other terminal of the second resistor is electrically connected to ground potential.

3. The integration type analog to digital converter according to claim 1,
   wherein the subtraction circuit includes a first transistor and a second transistor;
   wherein the input terminal of the subtraction circuit is electrically connected to a gate electrode of the first transistor;
   wherein one of a source electrode and a drain electrode of the first transistor is electrically connected to power source potential;
   wherein the other of the source electrode and the drain electrode of the first transistor is electrically connected to one of a source electrode and a drain electrode of the second transistor; and
   wherein the other of the source electrode and the drain electrode of the second transistor is electrically connected to ground potential.

4. The integration type analog to digital converter according to claim 3, wherein each of the first transistor and the second transistor is an n-channel transistor.

5. The integration type analog to digital converter according to claim 1,
   wherein the subtraction circuit includes an operational amplifier, a first transistor, and a second transistor;
   wherein the input terminal of the subtraction circuit is electrically connected to one of a source electrode and a drain electrode of the first transistor;
   wherein the other of the source electrode and the drain electrode of the first transistor is electrically connected to a gate electrode of the first transistor, a non-inverted input terminal of the operational amplifier of the subtraction circuit, and one of a source electrode and a drain electrode of the second transistor;

wherein an output terminal of the operational amplifier of the subtraction circuit is electrically connected to the inverted input terminal of the operational amplifier; and wherein the other of the source electrode and the drain electrode of the second transistor is electrically connected to ground potential.

6. The integration type analog to digital converter according to claim 5, wherein the first transistor is a p-channel transistor and the second transistor is an n-channel transistor.

7. An integration type analog to digital converter comprising:

an integrator including an operational amplifier, a capacitor, and a resistor, the capacitor being electrically connected between an inverted input terminal and an output terminal of the operational amplifier;

a first switch electrically connected to the capacitor in parallel;

a second switch;

a third switch wherein one terminal of the second switch and one terminal of the third switch are electrically connected to each other and to the inverted input terminal of the operational amplifier through the resistor;

a multiplier circuit; and a subtraction circuit, wherein an output terminal of the multiplier circuit and an input terminal of the subtraction circuit are electrically connected to each other and to a non-inverted input terminal of the operational amplifier;

wherein an input terminal of the multiplier circuit is electrically connected to the other terminal of the second switch; and wherein an output terminal of the subtraction circuit is electrically connected to the other terminal of the third switch.

8. The integration type analog to digital converter according to claim 7, wherein the multiplier circuit includes a first resistor and a second resistor;

wherein one terminal of the first resistor and one terminal of the second resistor are electrically connected to each other and the input terminal of the multiplier;

wherein the other terminal of the first resistor is electrically connected to the input terminal of the subtraction circuit; and wherein the other terminal of the second resistor is electrically connected to ground potential.

9. The integration type analog to digital converter according to claim 7, wherein the subtraction circuit includes a first transistor and a second transistor;

wherein the input terminal of the subtraction circuit is electrically connected to a gate electrode of the first transistor;

wherein one of a source electrode and a drain electrode of the first transistor is electrically connected to power source potential;

wherein the other of the source electrode and the drain electrode of the first transistor is electrically connected to one of a source electrode and a drain electrode of the second transistor; and wherein the other of the source electrode and the drain electrode of the second transistor is electrically connected to ground potential.

10. The integration type analog to digital converter according to claim 9, wherein each of the first transistor and the second transistor is an n-channel transistor.

11. The integration type analog to digital converter according to claim 7, wherein the subtraction circuit includes an operational amplifier, a first transistor, and a second transistor;

wherein the input terminal of the subtraction circuit is electrically connected to one of a source electrode and a drain electrode of the first transistor;

wherein the other of the source electrode and the drain electrode of the first transistor is electrically connected to a gate electrode of the first transistor, a non-inverted input terminal of the operational amplifier of the subtraction circuit, and one of a source electrode and a drain electrode of the second transistor;

wherein an output terminal of the operational amplifier of the subtraction circuit is electrically connected to the inverted input terminal of the operational amplifier; and wherein the other of the source electrode and the drain electrode of the second transistor is electrically connected to ground potential.

12. The integration type analog to digital converter according to claim 11, wherein the first transistor is a p-channel transistor and the second transistor is an n-channel transistor.

13. A semiconductor device comprising:

an antenna arranged to receive a signal;

a rectifier circuit arranged to be input the signal received by the antenna;

a power source circuit to be input the signal output by the rectifier circuit;

an integration type analog to digital converter arranged to convert the signal output by the power source circuit which is an analog signal into a digital signal; and an signal arithmetic portion arranged to be input the digital signal, wherein the signal arithmetic portion comprises a CPU, wherein integration type analog to digital converter comprises:

an integrator including an operation amplifier and a capacitor, the capacitor being electrically connected between an inverted input terminal and an output terminal of the operational amplifier;

a first switch electrically connected to the capacitor in parallel;

a second switch;

a third switch wherein a terminal of the second switch and a terminal of the third switch are electrically connected to each other and to the inverted input terminal of the operational amplifier;

a multiplier circuit; and a subtraction circuit, wherein an output terminal of the multiplier circuit and an input terminal of the subtraction circuit are electrically connected to each other and to a non-inverted input terminal of the operational amplifier;

wherein an input terminal of the multiplier circuit is electrically connected to the other terminal of the second switch; and wherein an output terminal of the subtraction circuit is electrically connected to the other terminal of the third switch.

14. The semiconductor device according to claim 13, wherein the multiplier circuit includes a first resistor and a second resistor;

wherein one terminal of the first resistor and one terminal of the second resistor are electrically connected to each other and the input terminal of the multiplier;

wherein the other terminal of the first resistor is electrically connected to the input terminal of the subtraction circuit; and wherein the other terminal of the second resistor is electrically connected to ground potential.

15. The semiconductor device according to claim 13, wherein the subtraction circuit includes a first transistor and a second transistor;

wherein the input terminal of the subtraction circuit is electrically connected to a gate electrode of the first transistor;

wherein one of a source electrode and a drain electrode of the first transistor is electrically connected to power source potential;

wherein the other of the source electrode and the drain electrode of the first transistor is electrically connected to one of a source electrode and a drain electrode of the second transistor; and wherein the other of the source electrode and the drain electrode of the second transistor is electrically connected to ground potential.

16. The semiconductor device according to claim 15, wherein each of the first transistor and the second transistor is an n-channel transistor.

17. The semiconductor device according to claim 13, wherein the subtraction circuit includes an operational amplifier, a first transistor, and a second transistor;

wherein the input terminal of the subtraction circuit is electrically connected to one of a source electrode and a drain electrode of the first transistor;

wherein the other of the source electrode and the drain electrode of the first transistor is electrically connected to a gate electrode of the first transistor, a non-inverted input terminal of the operational amplifier of the subtraction circuit, and one of a source electrode and a drain electrode of the second transistor;

wherein an output terminal of the operational amplifier of the subtraction circuit is electrically connected to the inverted input terminal of the operational amplifier; and wherein the other of the source electrode and the drain electrode of the second transistor is electrically connected to ground potential.

18. The semiconductor device according to claim 17, wherein the first transistor is a p-channel transistor and the second transistor is an n-channel transistor.

19. A sensor device comprising:

a sensor;

a sensor driving circuit;

a detection portion electrically connected to the sensor;

a the integration type analog to digital converter arranged to convert the signal output by the detected portion which is an analog signal into a digital signal; and a CPU arranged to be input the digital signal, wherein the integration type analog to digital converter comprises:

an integrator including an operation amplifier and a capacitor, the capacitor being electrically connected between an inverted input terminal and an output terminal of the operational amplifier;

a first switch electrically connected to the capacitor in parallel;

a second switch;

a third switch wherein a terminal of the second switch and a terminal of the third switch are electrically connected to each other and to the inverted input terminal of the operational amplifier;

a multiplier circuit; and a subtraction circuit, wherein an output terminal of the multiplier circuit and an input terminal of the subtraction circuit are electrically connected to each other and to a non-inverted input terminal of the operational amplifier;

wherein an input terminal of the multiplier circuit is electrically connected to the other terminal of the second switch; and wherein an output terminal of the subtraction circuit is electrically connected to the other terminal of the third switch.

20. The sensor device according to claim 19, wherein the multiplier circuit includes a first resistor and a second resistor;

wherein one terminal of the first resistor and one terminal of the second resistor are electrically connected to each other and the input terminal of the multiplier;

wherein the other terminal of the first resistor is electrically connected to the input terminal of the subtraction circuit; and wherein the other terminal of the second resistor is electrically connected to ground potential.

21. The sensor device according to claim 19, wherein the subtraction circuit includes a first transistor and a second transistor;

wherein the input terminal of the subtraction circuit is electrically connected to a gate electrode of the first transistor;

wherein one of a source electrode and a drain electrode of the first transistor is electrically connected to power source potential;

wherein the other of the source electrode and the drain electrode of the first transistor is electrically connected to one of a source electrode and a drain electrode of the second transistor; and wherein the other of the source electrode and the drain electrode of the second transistor is electrically connected to ground potential.

22. The sensor device according to claim 21, wherein each of the first transistor and the second transistor is an n-channel transistor.

23. The sensor device according to claim 19, wherein the subtraction circuit includes an operational amplifier, a first transistor, and a second transistor;

wherein the input terminal of the subtraction circuit is electrically connected to one of a source electrode and a drain electrode of the first transistor;

wherein the other of the source electrode and the drain electrode of the first transistor is electrically connected to a gate electrode of the first transistor, a non-inverted input terminal of the operational amplifier of the subtraction circuit, and one of a source electrode and a drain electrode of the second transistor;

wherein an output terminal of the operational amplifier of the subtraction circuit is electrically connected to the inverted input terminal of the operational amplifier; and wherein the other of the source electrode and the drain electrode of the second transistor is electrically connected to ground potential.

24. The sensor device according to claim 23, wherein the first transistor is a p-channel transistor and the second transistor is an n-channel transistor.

* * * * *